United States Patent
Itoh et al.

(10) Patent No.: US 7,678,646 B2
(45) Date of Patent: Mar. 16, 2010

(54) SEMICONDUCTOR DEVICE AND MANUFACTURING METHOD OF THE SAME

(75) Inventors: Akio Itoh, Kawasaki (JP); Naoya Sashida, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 542 days.

(21) Appl. No.: 11/326,187

(22) Filed: Jan. 6, 2006

(65) Prior Publication Data

US 2007/0032015 A1    Feb. 8, 2007

(30) Foreign Application Priority Data

Jul. 29, 2005  (JP) .............................. 2005-221010

(51) Int. Cl.
  *H01L 21/8242* (2006.01)
  *H01L 21/8238* (2006.01)
(52) U.S. Cl. .................. 438/254; 438/210; 438/256
(58) Field of Classification Search .............. 438/171, 438/190, 210, 238, 253, 256, 254
  See application file for complete search history.

(56) References Cited

U.S. PATENT DOCUMENTS

| | | | |
|---|---|---|---|
| 6,479,341 B1 * | 11/2002 | Lu | .............................. 438/239 |
| 2003/0222299 A1 | 12/2003 | Miura | |
| 2003/0227046 A1 * | 12/2003 | Ando et al. | .................. 257/310 |
| 2005/0130414 A1 | 6/2005 | Choi et al. | |

FOREIGN PATENT DOCUMENTS

| | | |
|---|---|---|
| JP | 2001-358311 | 12/2001 |
| JP | 2003-68993 | 3/2003 |
| JP | 2003-347517 A | 12/2003 |
| KR | 10-2005-0059400 | 6/2005 |

OTHER PUBLICATIONS

Korean Office Action dated Dec. 13, 2006 (mailing date), issued in corresponding Korean Patent Application No. 10-2006-0005405.

* cited by examiner

*Primary Examiner*—Zandra Smith
*Assistant Examiner*—Pamela E Perkins
(74) *Attorney, Agent, or Firm*—Westerman, Hattori, Daniels & Adrian, LLP

(57) ABSTRACT

To provide a semiconductor device capable of improving accuracy in finishing a hole in which a conductive plug right under a capacitor, and a manufacturing method of such a semiconductor device comprising the following steps: a step of forming first and second conductive plugs 32a, 32b in first and second holes 11a, 11b in a first insulating film 11; a step of forming a first opening 14a in an oxidation preventing insulating film 14; a step of forming an auxiliary conductive plug 36a in the first opening 14a; a step of forming a capacitor Q on the auxiliary conductive plug 36a; a step of forming third and fourth holes 41a, 41b in a second insulating film 41 covering the capacitor Q; a step of forming the second opening 14b in the oxidation preventing insulating film 14 under the fourth hole 41b; a step of forming a third conductive plug 47a in the third hole 41a; and a step of forming a fourth conductive plug 47b in the third hole 41a.

6 Claims, 19 Drawing Sheets

SEMICONDUCTOR DEVICE AND MANUFACTURING METHOD OF THE SAME

CROSS-REFERENCE TO RELATED APPLICATIONS

This application is based upon and claims the benefit of priority from the prior Japanese Patent Application No. 2005-221010, filed on Jul. 29, 2005, the entire contents of which are incorporated herein by reference.

TECHNICAL FIELD

The present invention relates to a semiconductor device and a manufacturing method of the same.

BACKGROUND OF THE INVENTION

For a nonvolatile memory capable of retaining information even when power is turned off, a flash memory and a ferroelectric memory are known.

Of the two, flash memory, which has a floating gate embedded in a gate insulating film of an insulated-gate field-effect transistor (IGFET), stores information by accumulating the charge representing the information and storing it in the floating gate. Flash memory, however, is disadvantageous in that a tunneling current has to flow through the gate insulating film when the information is written or erased, and this requires a relatively high voltage.

On the contrary, ferroelectric memory, which is also called FeRAM (Ferroelectric Random Access Memory), stores information by utilizing the hysteresis properties of a ferroelectric film formed in a ferroelectric capacitor. The ferroelectric film becomes polarized depending on the voltage applied between the upper electrode and the lower electrode of the capacitor, and the spontaneous polarization remains even when the voltage is removed. When the polarity of the applied voltage is reversed, the spontaneous polarization is also reversed. Information is written to the ferroelectric film by relating the direction of the spontaneous polarization to "1" and "0". The FeRAM is advantageous in that the voltage required for writing is lower than in a flash memory and that information can be written therein faster than in a flash memory.

The FeRAM is broadly grouped under either stack-type or planer-type depending on its structure. The latter, the planer type, has a MOS transistor and capacitor lower electrode formed on a semiconductor substrate which are electrically connected through metal wiring above the capacitor. The planar type tend to have a larger capacitor area.

On the contrary, in a stack-type FeRAM, a capacitor lower electrode is formed directly on a conductive plug connected to source/drain regions of a MOS transistor. The lower electrode and the MOS transistor are electrically connected through the conductive plug. This structure allows the capacitor to have a smaller area compared with the planer-type. Hence, the stack-type is advantageous to the miniaturization of FeRAM desired in the future.

In the stacked type FeRAM an opening in which the conductive plug is embedded directly under the capacitor must to be formed with high accuracy in order to achieve the desired miniaturization. Improving the accuracy in finishing the opening is an important factor in regard to miniaturization.

Examples of the abovementioned stack-type FeRAM are disclosed in Japanese Patent Laid-Open No. 2001-358311 and Japanese Patent Laid-Open No. 2003-68993.

DISCLOSURE OF THE INVENTION

It is an object of the present invention to provide a semiconductor device capable of improving accuracy by forming an opening in which a conductive plug is embedded directly under a capacitor and a manufacturing method of the same.

According to one aspect of the present invention, there is provided a semiconductor device comprising: a semiconductor substrate; first and second impurity diffusion regions formed at an interval in a surface layer of said semiconductor substrate; a first insulating film formed over said semiconductor substrate, having first and second holes over said first and second impurity diffusion regions respectively; first and second conductive plugs formed in said first and second holes respectively, and electrically connected to said first and second impurity diffusion regions respectively; an oxidation preventing insulating film formed on said first insulating film, having first and second openings on said first and second conductive plugs respectively; an auxiliary conductive plug formed in said first opening; a capacitor composed by forming a lower electrode, a capacitor dielectric film, and an upper electrode in this order on said auxiliary conductive plug and on said oxidation preventing insulating film located around said first opening; a second insulating film covering said capacitor, having a third hole above said upper electrode, and having a fourth hole above said second opening; a third conductive plug formed in said third hole, electrically connected to said upper electrode; and a fourth conductive plug formed in said fourth hole and in said second opening, electrically connected to said second conductive plug.

Furthermore, according to the another aspect of the present invention, there is provided a manufacturing method of a semiconductor device comprising: forming first and second impurity diffusion regions at an interval from each other in a surface layer of a semiconductor substrate; forming a first insulating film over said semiconductor substrate; forming first and second holes in said first insulating film above said first and second impurity diffusion regions respectively by patterning said first insulating film; forming first and second conductive plugs electrically connected to said first and second impurity diffusion regions respectively in said first and second holes; forming an oxidation preventing insulating film on said first insulating film and on said first and second conductive plugs; forming a first opening in said oxidation preventing insulating film above said first conductive plug by removing said oxidation preventing insulating film from above said first conductive plug; forming a conductive film on said oxidation preventing insulating film and in said first opening above said first conductive plug; polishing said conductive film to remove said conductive film from said oxidation preventing insulating film, while leaving said conductive film in said first opening as an auxiliary conductive plug; forming a capacitor by stacking a lower electrode, a capacitor dielectric film and an upper electrode in this order on said auxiliary conductive plug and on said oxidation preventing insulating film located around said first opening; forming a second insulating film covering said capacitor; forming third and fourth holes in said second insulating film above said upper electrode and said second hole respectively by patterning said second insulating film, and further forming a second opening in said oxidation preventing insulating film under said fourth hole; forming a third conductive plug electrically connected to said upper electrode in said third hole; and forming a fourth conductive plug in said fourth hole and said second opening which is electrically connected to said second conductive plug.

According to the present invention, the auxiliary conductive plug is formed in the first opening of the oxidation preventing insulating film, and the lower electrode of the capacitor is electrically connected to the first impurity diffusion region by the auxiliary conductive plug and the first conductive plug thereunder. Since the first opening is formed by patterning only the oxidation preventing insulating film, the etching amount in the patterning is reduced compared with the process in which a contact hole is formed in both the oxidation preventing insulating film and the first insulating film thereunder. As a result of the invention, a resist pattern used as an etching mask is not substantially thinned during etching, and the first opening in which the auxiliary conductive plug is formed can be formed with high accuracy.

Furthermore, in the step of forming the abovementioned first opening in the oxidation preventing insulating film, an alignment opening may be formed at an interval from the first opening in the oxidation preventing insulating film. In this case, a conductive film is formed also in the alignment opening in the step of forming a conductive film in the first opening, and the conductive film is left in the alignment opening as an alignment mark in the step of polishing the conductive film.

Since this alignment opening is formed in the oxidation preventing insulating film, its depth is shallow similarly to the abovementioned first opening, this allows the conductive film required for filling the alignment opening to be formed thin. Therefore, the overpolish amount for leaving no unpolished surface can be reduced in the step of polishing the conductive film. Overpolishing results in occurrences of a recess on the top surface of the auxiliary conductive plug in the first opening, and occurrence of dishing on the oxidation preventing insulating film. The present invention avoids the need for excessive polishing.

Moreover, the lower electrode of the capacitor on the auxiliary conductive plug has even surface flatness maintained. This results in a decrease in poor orientation of the lower electrode due to unevenness of the underlying layer. Similarly, the orientation of the capacitor dielectric film thereon is also improved by the lower electrode so that good orientation is maintained at the dielectric film of the capacitor.

Furthermore, as described above, since dishing does not occur in the oxidation preventing insulating film it is possible to maintain the oxidation preventing insulating film thick enough to be impermeable to oxygen. Hence, the second conductive plug under the oxidation preventing insulating film is protected from an oxidizing atmosphere and the second conductive plug is less likely to experience contact failure.

In addition, by forming a conductive film thick enough to completely fill the abovementioned alignment opening, a large concave portion is not formed on the top surface of an alignment mark. When the conductive film is too thin scattering may result from oxygen penetrating the conductive film. Since the conductive film formed on the alignment mark is not thin, even when annealing the capacitor dielectric film in an oxygen atmosphere, the conductive film blocks oxygen, and thereby prevents the alignment mark from scattering.

According to the present invention, the first opening in which the auxiliary conductive plug is embedded is formed in the oxidation preventing insulating film. As a result, the etching amount in forming the first opening by patterning can be reduced, and the etching mask for patterning can be prevented from becoming thinner by etching. Hence this results in improved accuracy in forming the first opening.

Furthermore, in the present invention, even when forming an alignment opening in the oxidation preventing insulating film simultaneously with the abovementioned first opening, the conductive film required for embedding the alignment opening is thin, and the amount of overpolishing of the conductive film is thereby reduced. Since this improves the flatness of the top surface of each of the auxiliary conductive plug and oxidation preventing insulating film, the orientation of the lower electrode of the capacitor can be improved and the second conductive plug below the oxidation preventing insulating film can be protected from an oxidizing atmosphere securely.

DETAILED DESCRIPTION OF THE INVENTION

Figure 1:
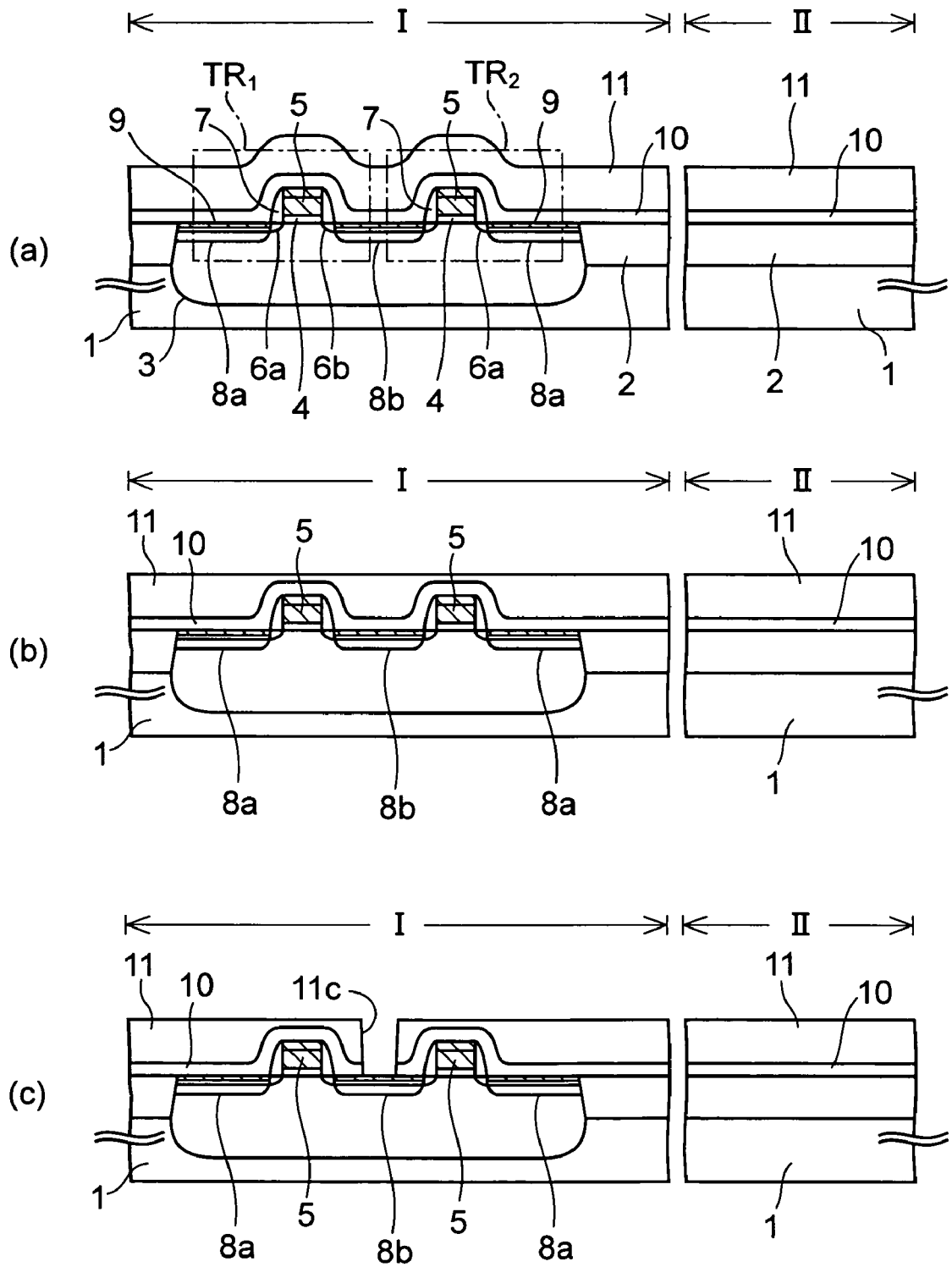
FIGS. 1(a)-(c) are cross-sectional views of a hypothetical semiconductor device in production wherein transistors and a first contact hole are formed.
Figure 2:
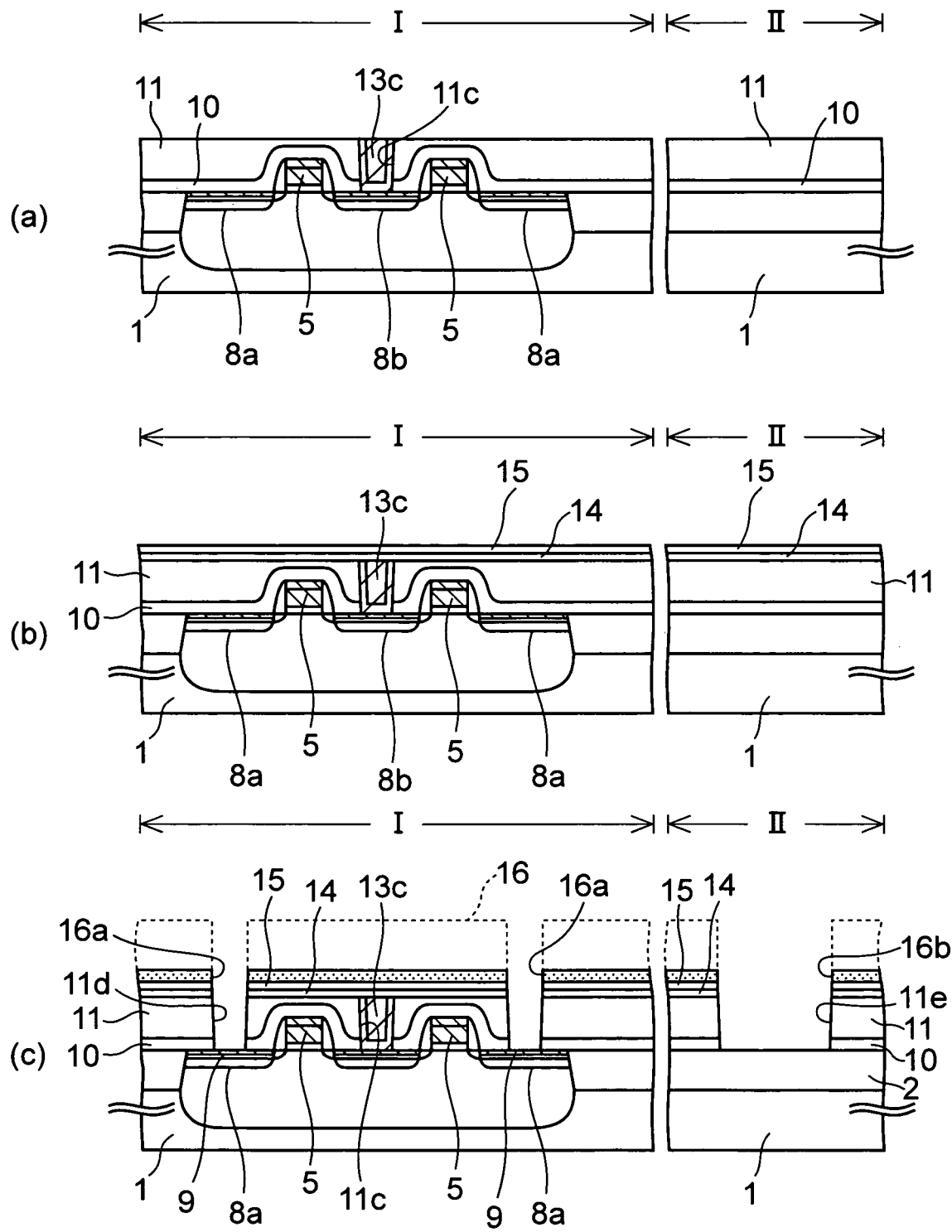
FIGS. 2(a)-(c) are cross-sectional views of the hypothetical semiconductor device in production wherein a conductive plug and alignment opening are formed.
Figure 3:
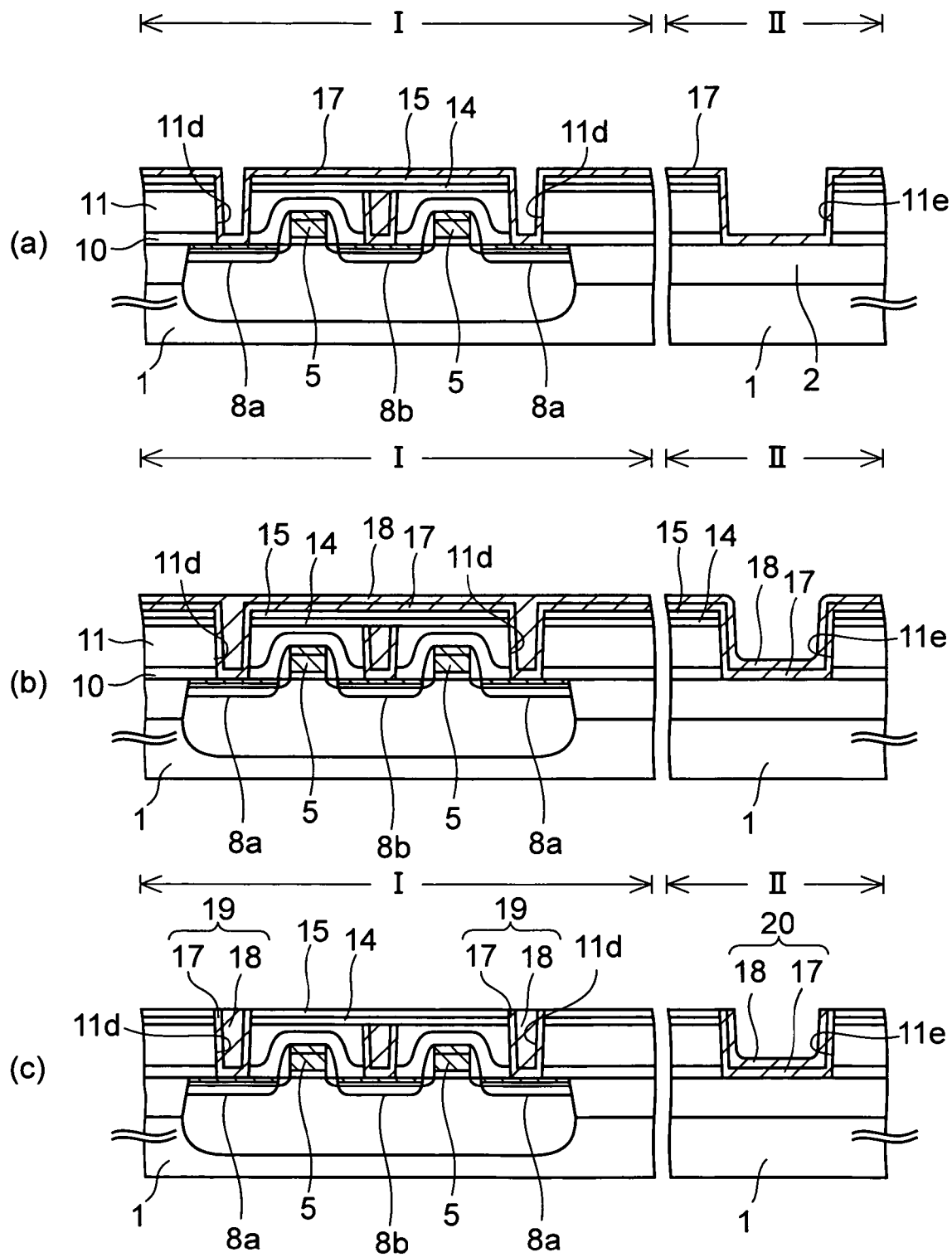
FIGS. 3(a)-(c) are cross-sectional views of the hypothetical semiconductor device in production wherein second contact holes and conductive plugs are formed.
Figure 4:
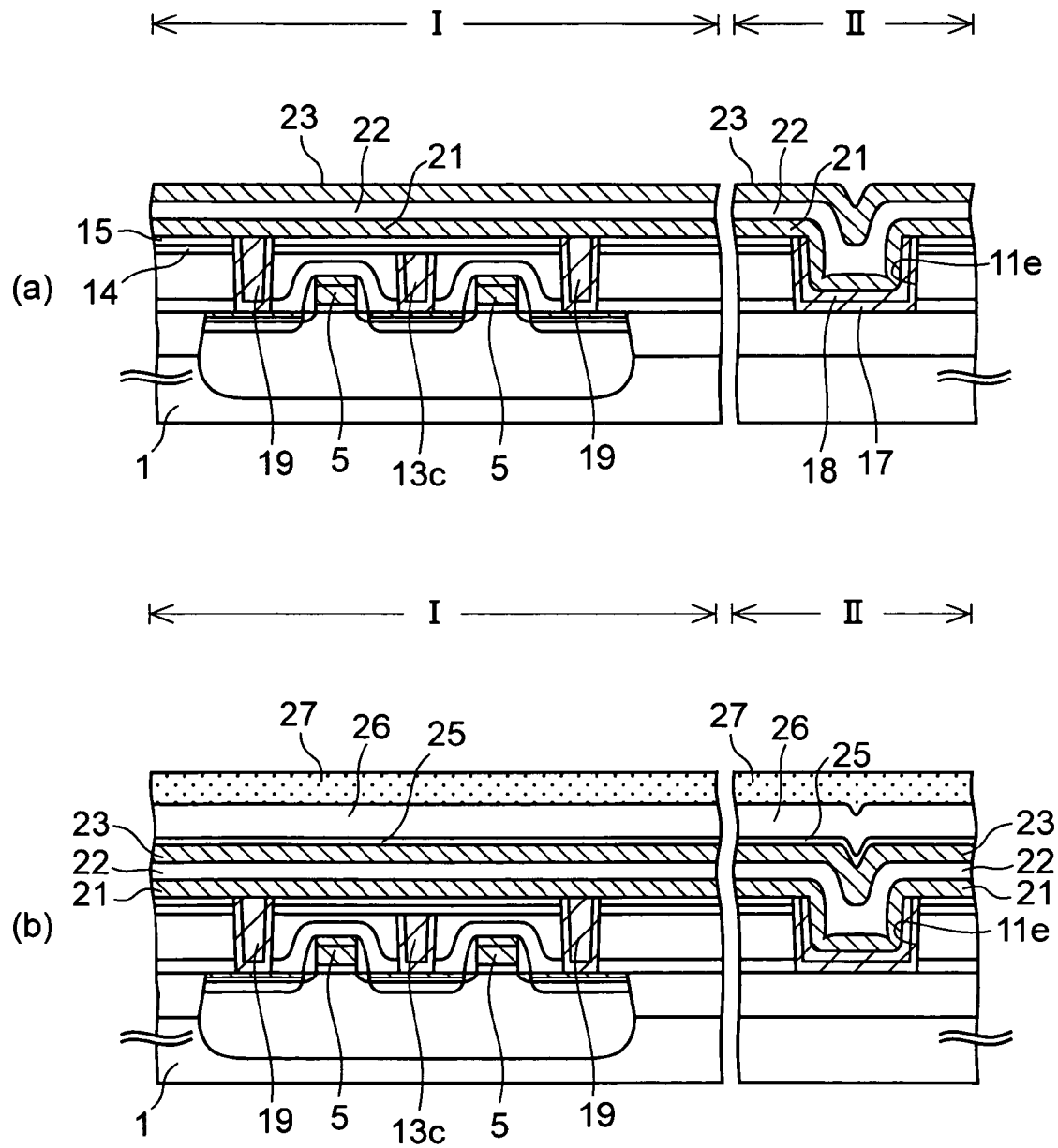
FIGS. 4(a), (b) are cross-sectional views of the hypothetical semiconductor device in production wherein capacitor layers, photoresist and masks are formed.
Figure 5:
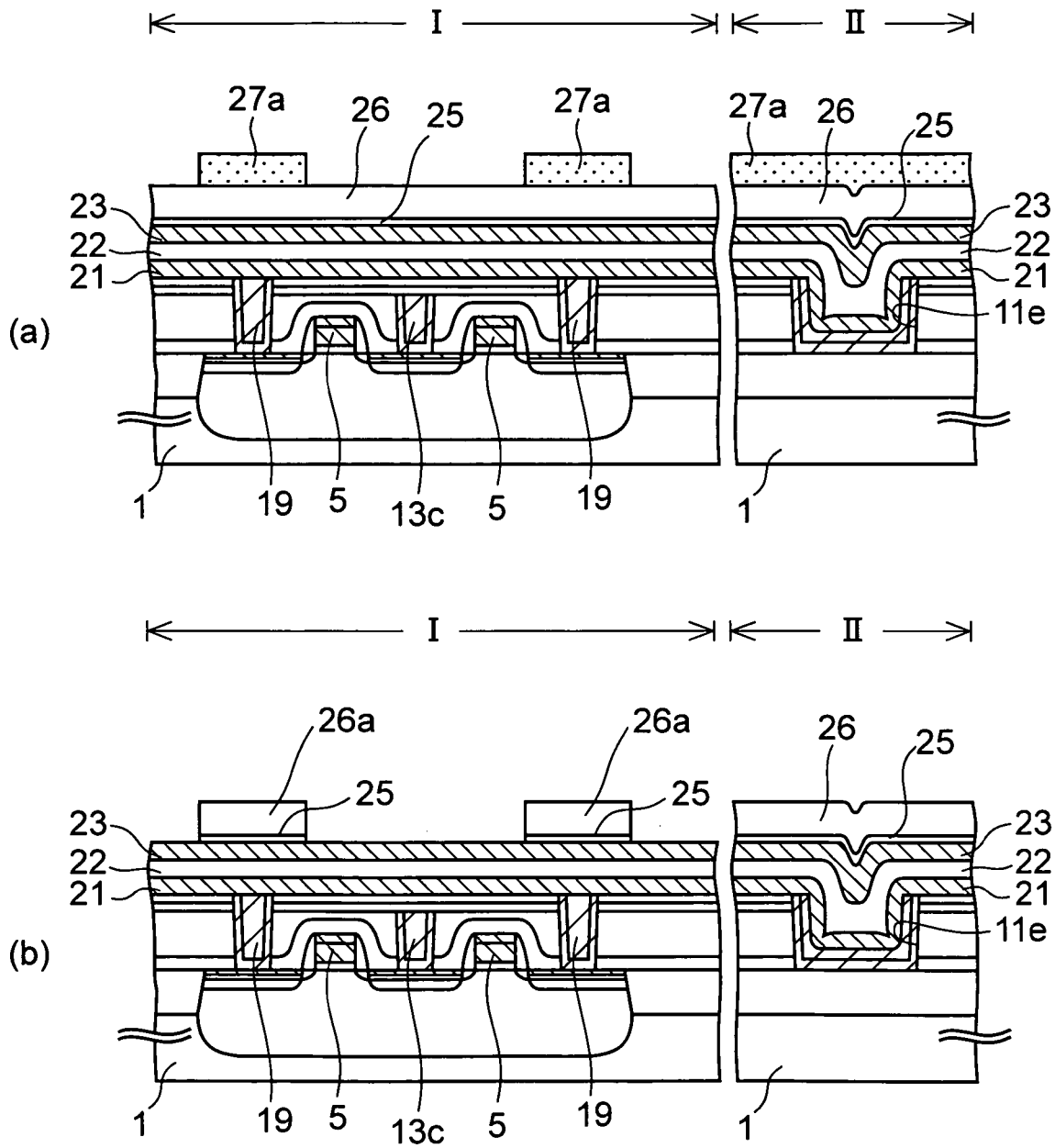
FIGS. 5(a), (b) are cross-sectional views of the hypothetical semiconductor device in production wherein a photoresist and masks are patterned.
Figure 6:
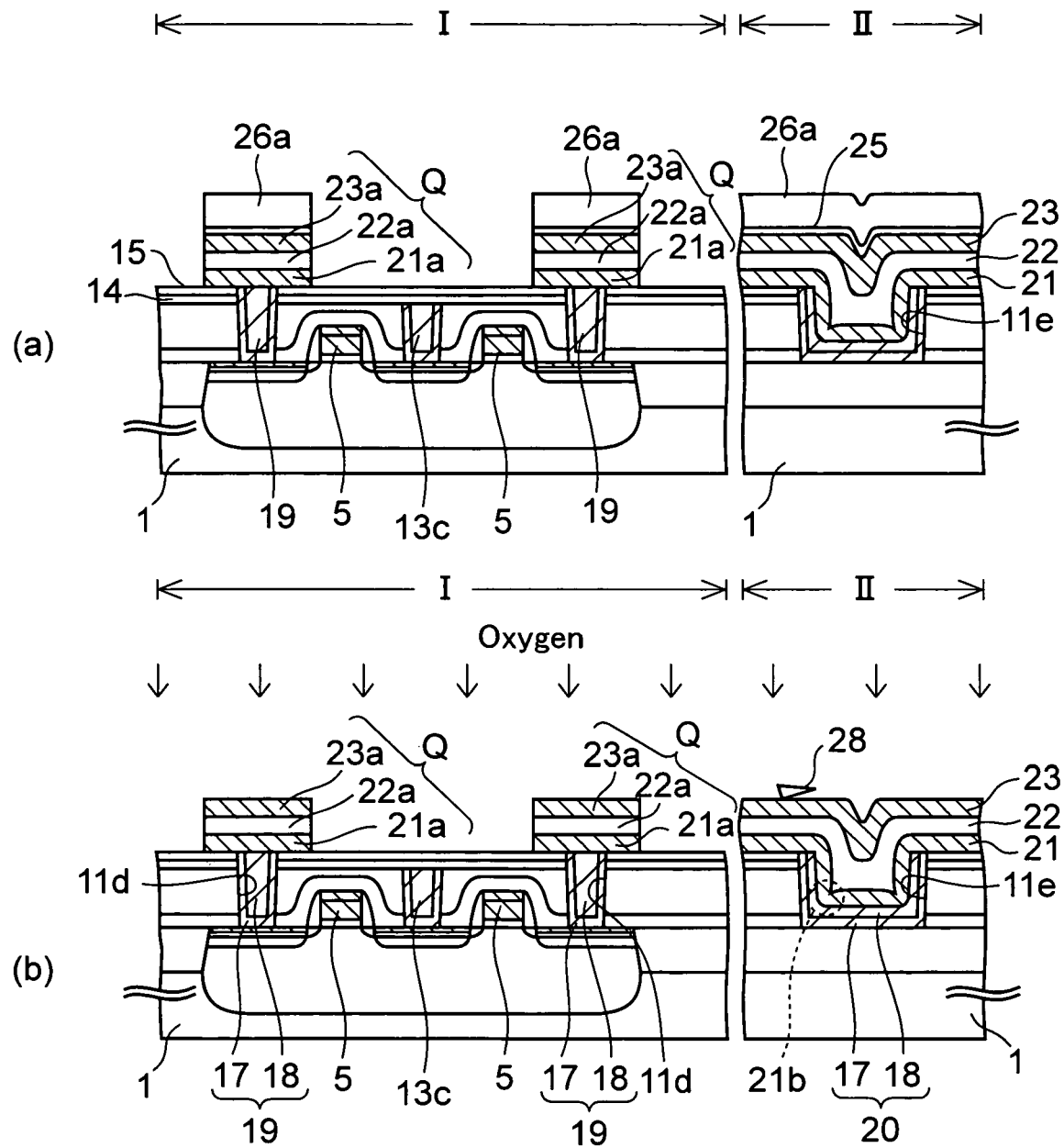
FIGS. 6(a), (b) are cross-sectional views of the hypothetical semiconductor device in production wherein a mask, capacitor and alignment layers are patterned.

Hereinafter, embodiments of the present invention will be described in detail with reference to the accompanying drawings.

Preliminary Explanation

The semiconductor device, which is an FeRAM of the stack-type, is produced as follows. FIG. 1-FIG. 6 are cross-sectional views of a hypothetical semiconductor device in production. Note that these figures include a first region designated as cell region I in which a ferroelectric capacitor is formed and a second region designated as peripheral region II such as a scribe region.

In order to obtain the sectional structure as shown in FIG. 1(a) the following steps are performed.

First, a trench which defines an active region of a transistor is formed on the surface of an n-type or p-type silicon (semiconductor) substrate 1. FIG. 1(a) discloses Shallow Trench Isolation (STI) wherein an insulating film of silicon oxide or the like is embedded in substrate 1 as a device isolation insulating film 2. Note that a device isolation structure is not limited to STI and the device isolation insulating film 2 may be formed by a LOCOS (Local Oxidation of Silicon) method.

P-type impurities are then introduced into the active region of the silicon substrate 1 so as to form a p-well 3. After which the surface of the active region is thermally oxidized to form a thermal oxide film as a gate insulating film 4.

An amorphous or polycrystalline silicon film is then formed on the entire upper surface of the silicon substrate 1. The silicon film is patterned by photolithography to form two gate electrodes 5.

The two gate electrodes 5 are arranged at an interval in parallel on the p-well 3, so that the gate electrodes 5 compose a part of word line.

Next, using the gate electrode 5 as a mask, n-type impurities are introduced into the silicon substrate 1 by ion-implantation to form first and second source/drain extensions 6a, 6b.

Then, an insulating film is formed on the entire upper surface of the silicon substrate 20 and is then etched-back to form insulating side walls 7 beside the gate electrode 5. The insulating film, for example may be a silicon oxide film formed by a CVD method.

Subsequently, ion-implantation of n-type impurities into the silicon substrate 1 is performed again while using the insulating side walls 7 and the gate electrode 5 as a mask. This results in first and second source/drain regions (first and second impurity diffusion regions) 8a, 8b are formed at an interval from each other in the surface layer of the silicon substrate 1 beside the two gate electrodes 5.

The above steps result in, first and second MOS transistors $TR_1$, $TR_2$ formed from the gate insulating film 4, the gate electrode 5, and the first and second source/drain regions 8a, 8b located on the active region of the silicon substrate 1.

Next, a refractory metal layer such as a cobalt layer is formed on the entire upper surface of the silicon substrate 1 by a sputtering method. The refractory metal layer is heated to react with the silicon to form a refractory metal silicide layer 9 on the silicon substrate 1. The refractory metal silicide layer 9 is also formed on the surface layer of the gate electrode 5, thereby making the resistance of the gate electrode 5 lower. Unreacted portions of the refractory metal layer are removed by wet etching.

A silicon nitride (SiN) film of about 80 nm thick is then formed on the entire upper surface of the silicon substrate 1 as a cover insulating film 10. Next, a plasma CVD method using TEOS gas is performed to form a silicon oxide film of about 1100 nm thick on the cover insulating film 10 as a first insulating film 11.

Next, as shown in FIG. 1(b), the top surface of the above-mentioned first insulating film 11 is polished and planarized by a CMP (Chemical Mechanical Polishing) method. As a result of the CMP, the first insulating film 11 becomes about 800 nm thick on the flat surface of the silicon substrate 1.

As shown in FIG. 1(c), the cover insulating film 10 and the first insulating film 11 are patterned by photolithography to form a first contact hole 11c directly above the second source/drain region 8b between two gate electrodes 5.

Next, as shown in FIG. 2(a), an electrically conductive first contact plug 13c is formed in the first contact hole 11c. The first contact plug 13c is electrically connected to the source/drain region 8b. The first contact plug 13c is mainly composed of tungsten which is susceptible to oxidation. Hence, in-process oxidation may cause contact failure when tungsten is used.

Therefore, in the next step, as shown in FIG. 2(b), a silicon oxide nitride (SiON) film of about 130 nm thick is formed as an oxidation preventing insulating film 14 by plasma CVD to protect the first contact plug 13c from an oxidizing atmosphere.

A silicon oxide film of about 200 nm thick is then formed on the oxidation preventing insulating film 14 by plasma CVD as an insulating adhesive film 15.

Subsequently, as shown in FIG. 2(c), a photoresist is coated on the insulating adhesive film 15, and the photoreist is exposed and developed to form a first resist pattern 16. The first resist pattern 16 has a hole-shaped first window 16a over the first source/drain region 8a in the cell region I, and has a wide second window 16b in the peripheral region II.

The cover insulating film 10, the first insulating film 11, the oxidation preventing insulating film 14 and the insulating adhesive film 15 are then etched through the first and second windows 16a, 16b by RIE (Reactive Ion Etching) to form a second contact hole 11d in the insulating films in the cell region I and to form an alignment opening 11e in the peripheral region II.

The opening 11e is used for aligning an exposure system with the silicon substrate 1 at the time of photolithographic formation of a capacitor, which is described later herein.

In this case, the second contact hole 11d is deeper than the first contact hole 11c due to the added thickness of the oxidation preventing insulating film 14 and insulating adhesive film 15. Therefore, an etching amount in the etching step of the second contact hole 11d is more than that of the first contact hole 11c. Hence, the first resist pattern 16 is exposed to an RIE etching atmosphere for a longer time. As shown in FIG. 2(c), the first resist pattern 16 becomes thinner during etching and the first resist pattern 16 as an etching mask becomes extremely thin by the time etching finishes. Due to this thinning of the first resist pattern 16, it is difficult to form with a high degree of accuracy a deep second contact hole 11d. This problem appears particularly prominently when forming the minute diameter second contact hole 11d since the first resist pattern 16 must become thinner during the lengthy etching process.

Subsequently, the first resist pattern 16 is removed.

Next, as shown in FIG. 3(a), a titanium film and then a titanium nitride film are formed by the sputtering method on the entire upper surface of the silicon substrate 1 as a barrier metal film 17. Note that the titanium nitride film may be formed by the CVD method. The barrier metal film 17 is also formed inside each of the abovementioned second contact hole 11d and opening 11e.

Next, as shown in FIG. 3(b), a tungsten film 18 is formed on the abovementioned barrier metal film 17, and the second contact hole 11d is completely filled with the tungsten film 18.

Although the tungsten film 18 is also formed in the alignment opening 11e, it does not fill the opening. The formation process requires only forming the film to the extent that it fills the second contact hole 11d. In this example, therefore, the tungsten film 18 is formed to have a minimum thickness required for filling the second contact hole 11d. By utilizing this formation process, the opening 11e, which is wider than the second contact hole 11d, is not completely filled with the tungsten film 18 as shown in FIGS. 3(b) and (c).

Subsequently, as shown in FIG. 3(c), the excess barrier metal film 17 and tungsten film 18 on the insulating adhesive film 15 are removed by the CMP method so that the films are left only in the second contact hole 11d and opening 11e. The barrier metal film 17 and tungsten film 18 in the second contact hole 11d are used as a second contact plug 19 while the films left in the opening 11e in the peripheral region II become an alignment mark 20.

Next, as shown in FIG. 4(a), an iridium film of about 50-200 nm in thickness, 100 nm for example, is formed by the sputtering method to make a conductive film for a lower electrode 21.

Thereafter, a PZT (Lead Zirconate Titanate; $PbZrTiO_3$) film about 50-150 nm thick, 100 nm for example, is formed on the conductive film for lower electrode 21 by a MOCVD (Metal Organic CVD) method to make a ferroelectric film 22.

Subsequently, an iridium oxide ($IrO_2$) film, about 50-200 nm thick, for example 100 nm thick, is formed by the sputtering method on the ferroelectric film 22 to make a conductive film for an upper electrode 23.

The conductive film for lower electrode 21, ferroelectric film 22 and conductive film for upper electrode 23 thus laminated, are later patterned to become a capacitor lower electrode, a capacitor dielectric film and a capacitor upper electrode respectively.

Next, as shown in FIG. 4(b), after a titanium nitride film of about 200 nm thick is formed by the sputtering method on the conductive film for upper electrode 23 as a first mask material layer 25. A silicon oxide film of about 600 nm thick is formed on the first mask material 25 by the CVD method as a second mask material layer 26.

Subsequently, a photoresist 27 is coated on the second mask material layer 26.

Next, a description is given of the steps necessary to obtain a sectional structure as shown in FIG. 5(a).

First, the silicon substrate 1 is put in an exposure system such as a stepper. A concave portion on the surface of the second mask material layer 26, having resulted from the alignment opening 11e not being completely filled, is optically detected so that the exposure system is aligned with the silicon substrate 1. Subsequently, the photoresist 27 in the cell region I is exposed in the exposure system and then developed so as to form a resist pattern for capacitor 27a having a planer shape of the capacitor. Also, the resist pattern for capacitor 27a covers the alignment opening 11e in the peripheral region II.

Next, a description is given of the steps necessary to obtain a sectional structure as shown in FIG. 5(b).

First, a second mask material layer 26 is etched with the resist pattern for capacitor 27a as a mask to form a hard mask 26a. The resist pattern for capacitor 27a is removed, and the first hard mask layer 25 is etched using the hard mask 26a as a mask until the first mask material layer 25 is left only under the hard mask 26a.

Subsequently, as shown in FIG. 6(a), using the hard mask 26a as an etching mask, the conductive film for lower electrode 21, the ferroelectric film 22 and the conductive film for upper electrode 23 are etched simultaneously. The etching results in a capacitor Q composed of the stacked lower electrode 21a, capacitor dielectric film 22a, and upper electrode 23a in this order formed directly over the second contact plug 19.

Note that the conductive film for lower electrode 21, the ferroelectric film 22 and the conductive film for upper electrode 23 are not etched in the peripheral region II but left under the hard mask 26a.

Subsequently, as shown in FIG. 6(b), the hard mask 26a and the first mask material layer 25 are removed by wet etching and dry etching.

Then, in order to repair any damage that the capacitor dielectric film 22a receives due to etching or sputtering from the formation of the capacitor Q, the capacitor Q is annealed in oxygen atmosphere. Such anneal is also called recovery anneal.

Incidentally, in the abovementioned example, since the tungsten film 18 composing the contact plug 19 is formed to the minimum thickness required for filling the second contact hole 11d, the tungsten film 18 incompletely fills the opening 11e that is wider than the second contact hole 11d. Therefore, as shown in FIG. 6(b), the conductive film for lower electrode 21 composing the lower electrode 21a of the capacitor Q is left in the opening 11e, and oxygen from the abovementioned recovery anneal reaches the conductive film for lower electrode 21.

However, since the conductive film for lower electrode 21 is formed by the sputtering method which is low in coverage, the lower electrode's thickness is uneven in the opening 11e. Accordingly, a thin portion 21b occurs in the conductive film for lower electrode 21 and the abovementioned oxygen intrudes from the thin portion 21b into the tungsten film 18. When this happens, the tungsten film 18, which is extremely easily oxidizable compared with other metals, is oxidized near the thin portion 21b. This results in the oxidized tungsten expanding in the space enclosed by the conductive film for lower electrode 21. Residual film 28 composed of any one of the conductive film for lower electrode 21, the ferroelectric film 22 and the conductive film for upper electrode 23 is scattered around by this expansion. The residual film 28 may cause device and/or pattern failures in the photolithographic processes conducted in the following steps.

In order to prevent film 28 from peeling, it is conceivable to fill the opening 11e completely with the tungsten film 18 in the peripheral region II so as not to leave the conductive film for lower electrode 21 in the peripheral region II.

Figure 7:
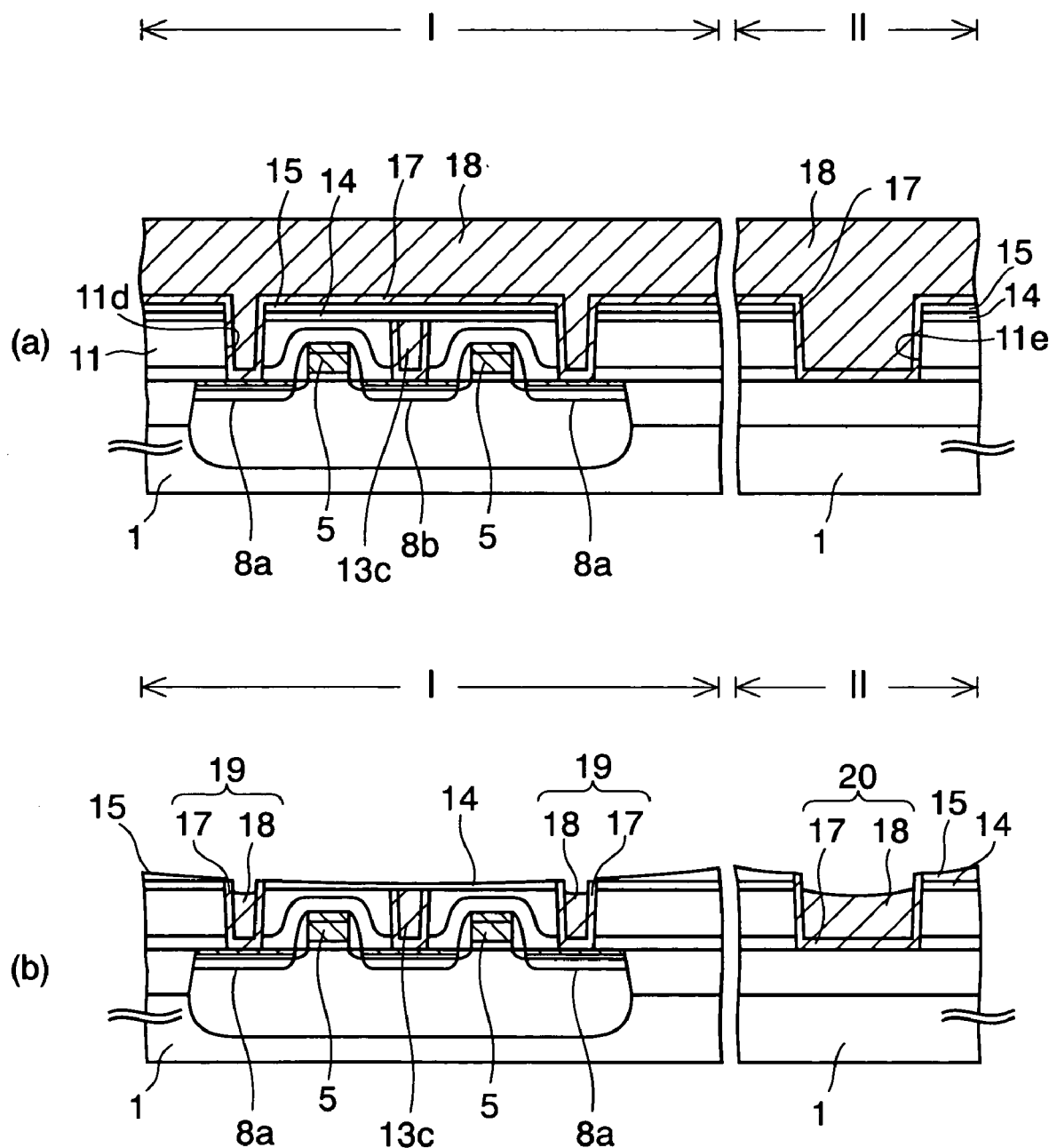
FIGS. 7(a), (b) are cross-sectional views of a hypothetical semiconductor device in production in which an alignment opening is completely filled with a tungsten film.
Figure 8:
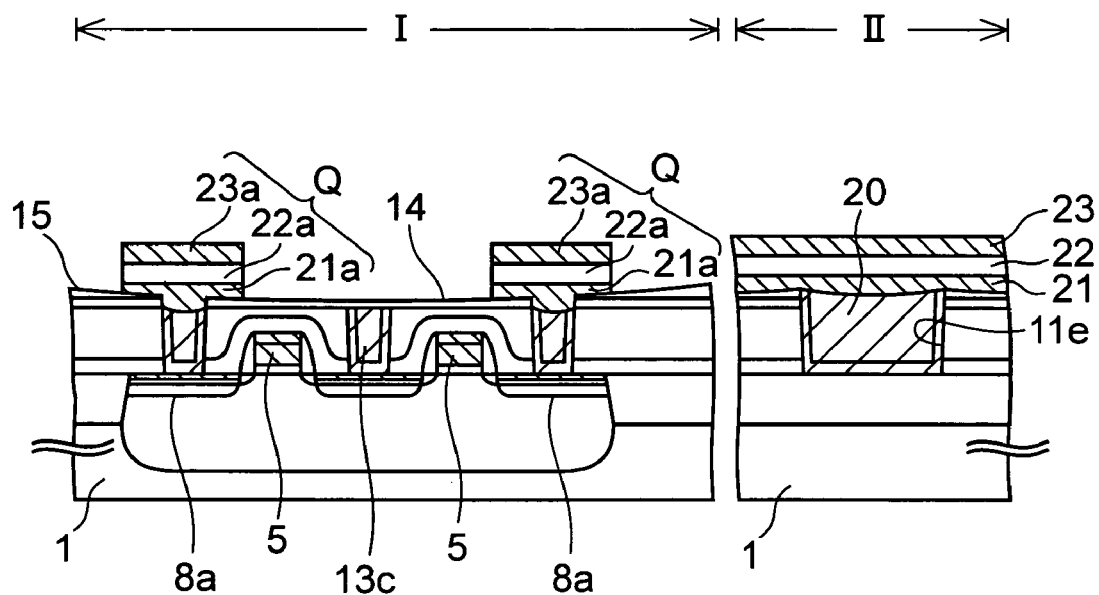
FIG. 8 is a cross-sectional view of the hypothetical semiconductor device in production in which the alignment opening is completely filled with the tungsten film.
Figure 9:
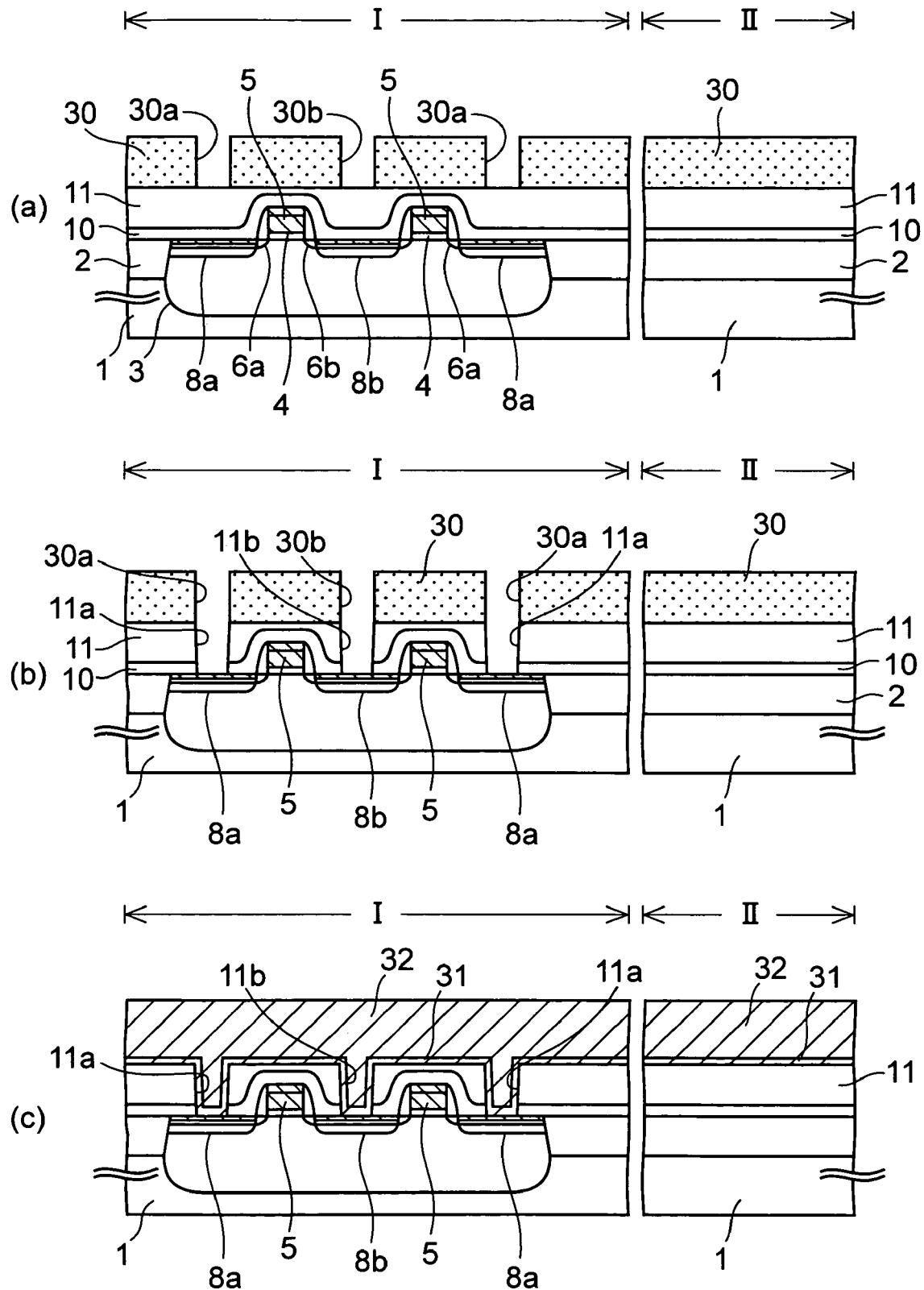
FIGS. 9(a)-(c) are cross-sectional views of a semiconductor device in production according to a first embodiment of the present invention in which first and second contact holes and plugs are formed.
Figure 10:
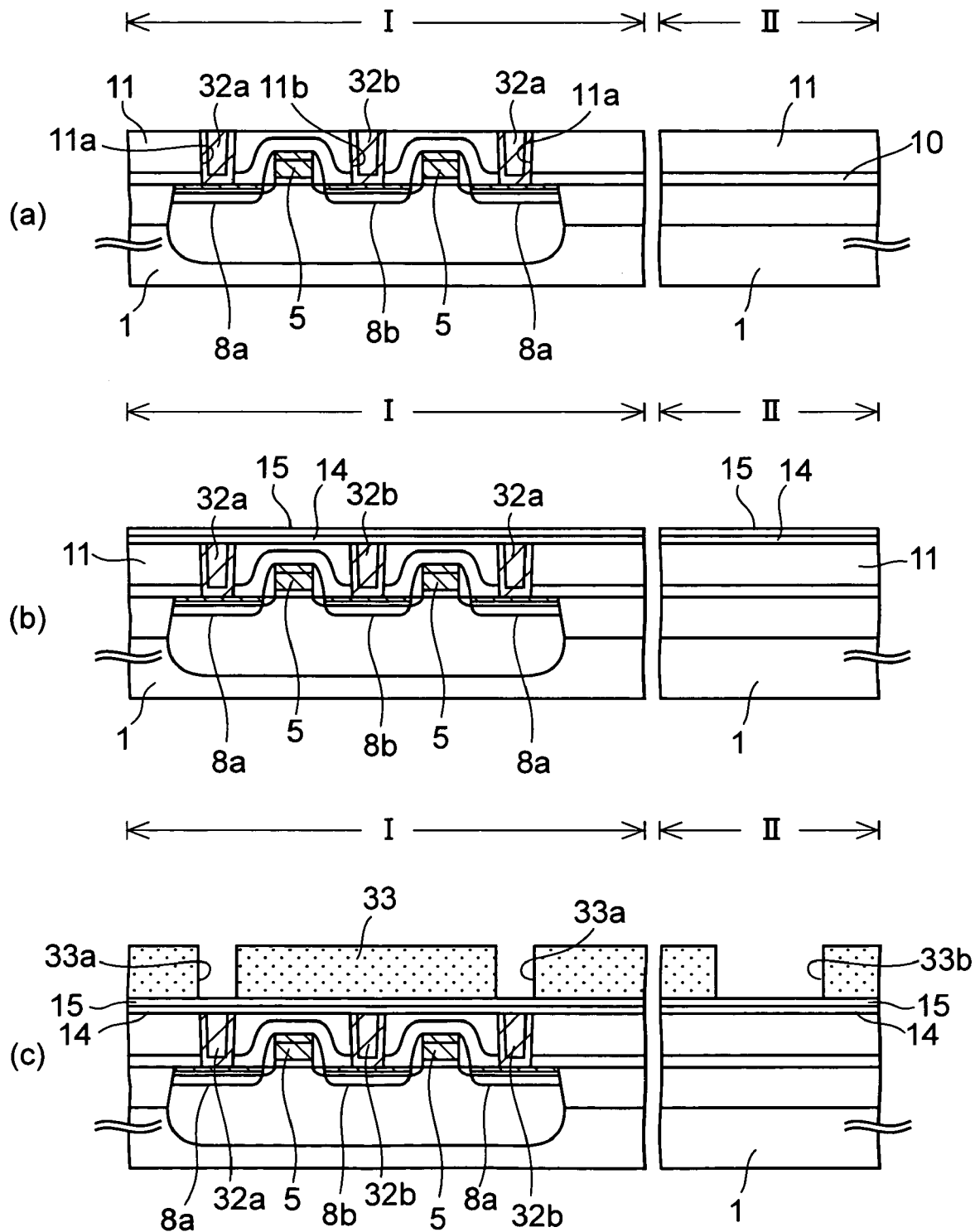
FIGS. 10(a)-(c) are cross-sectional views of the semiconductor device in production according to the first embodiment of the present invention in which first and second contact plugs are finalized, and third and fourth windows are formed in a resist pattern.
Figure 11:
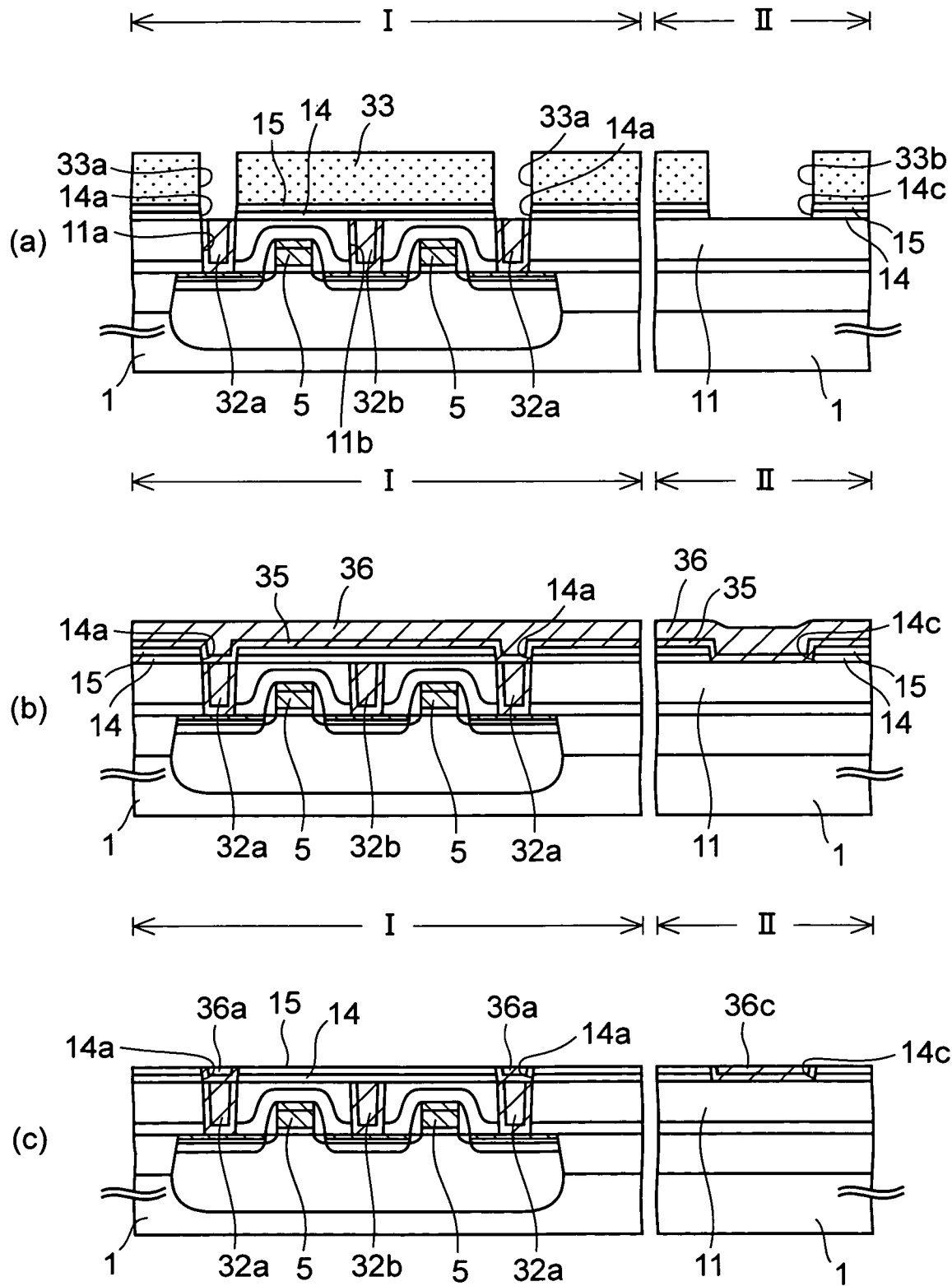
FIGS. 11(a)-(c) are cross-sectional views of the semiconductor device in production according to the first embodiment of the present invention in which third and forth windows are finalized, and auxiliary contact plugs and an alignment mark are formed.
Figure 12:
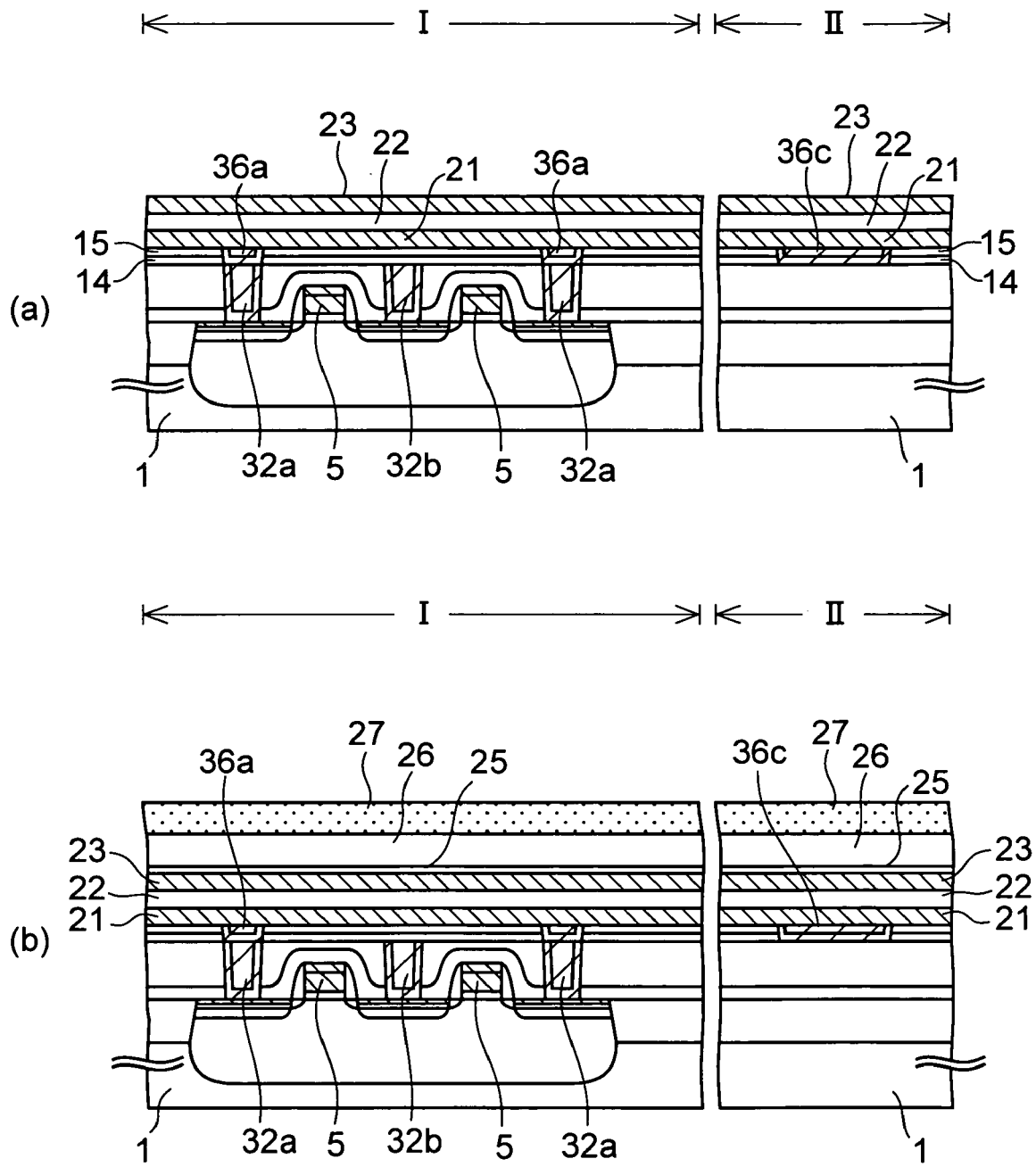
FIGS. 12(a), (b) are cross-sectional views of the semiconductor device in production according to the first embodiment of the present invention in which layers for the capacitors, mask material and resist are formed.
Figure 13:
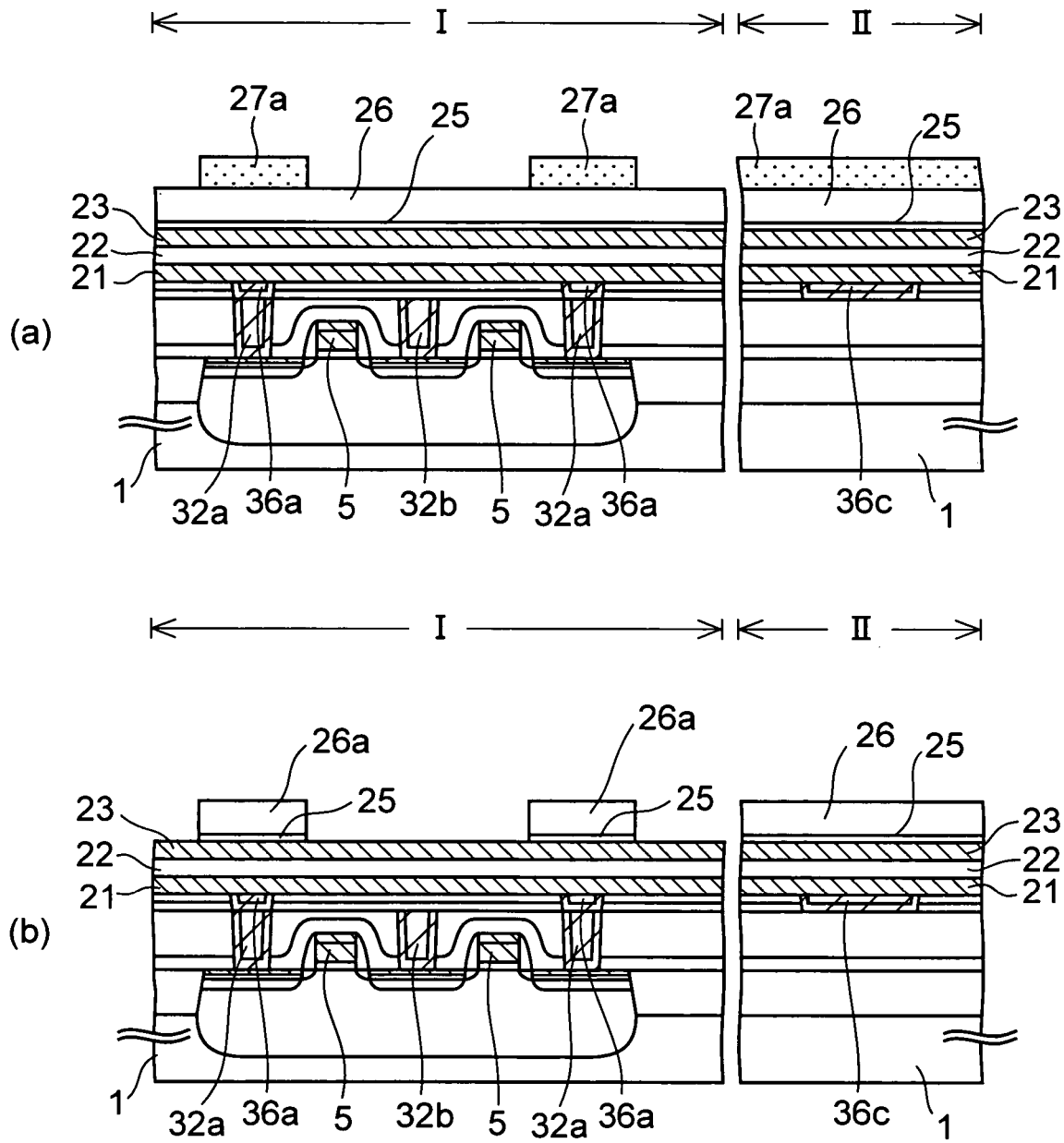
FIGS. 13(a), (b) are cross-sectional views of the semiconductor device in production according to the first embodiment of the present invention in which resist and second mask material are patterned and resist is removed.
Figure 14:
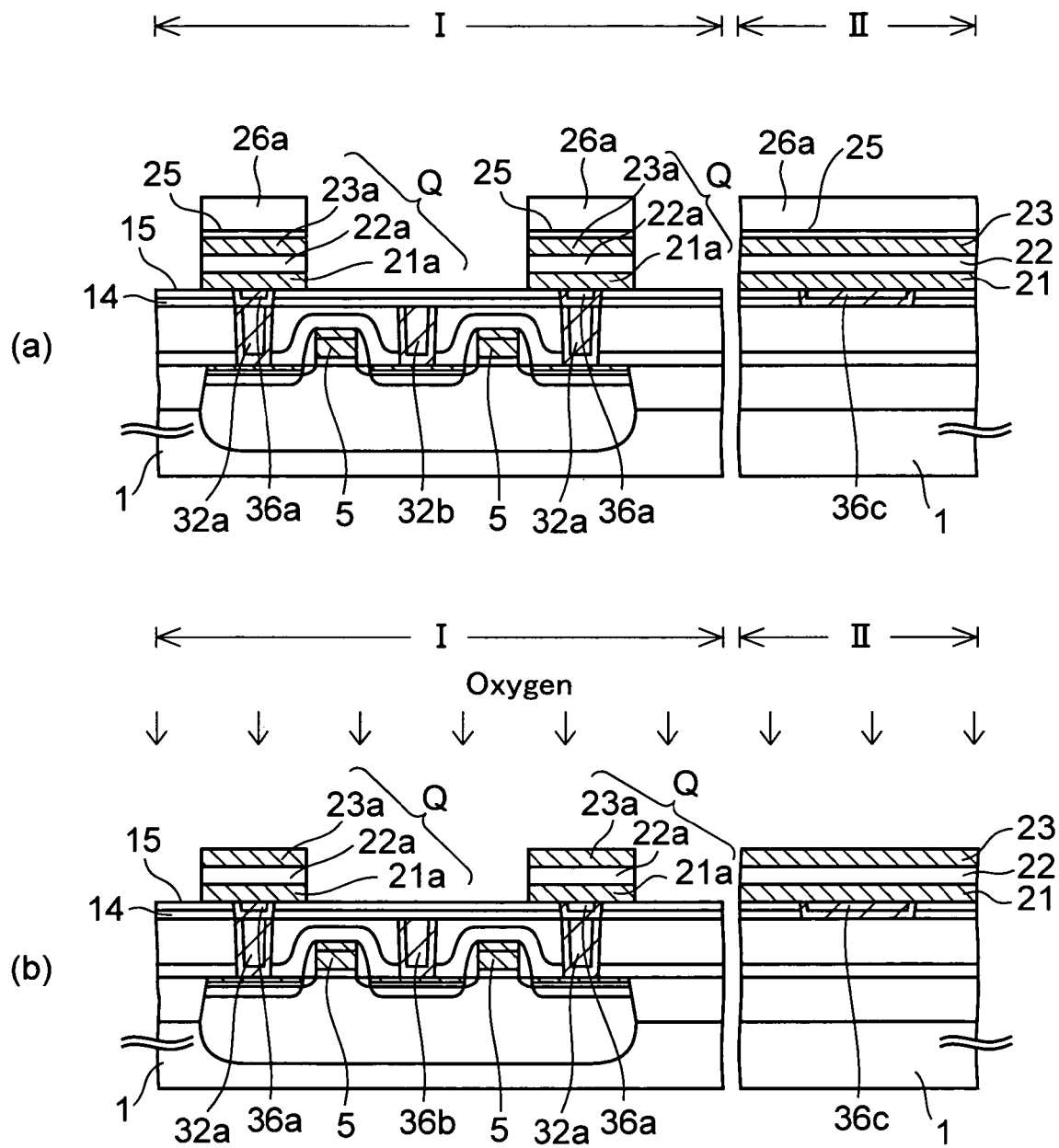
FIGS. 14(a), (b) are cross-sectional views of the semiconductor device in production according to the first embodiment of the present invention in which a first mask material and capacitor layers are patterned and mask materials are removed.
Figure 15:
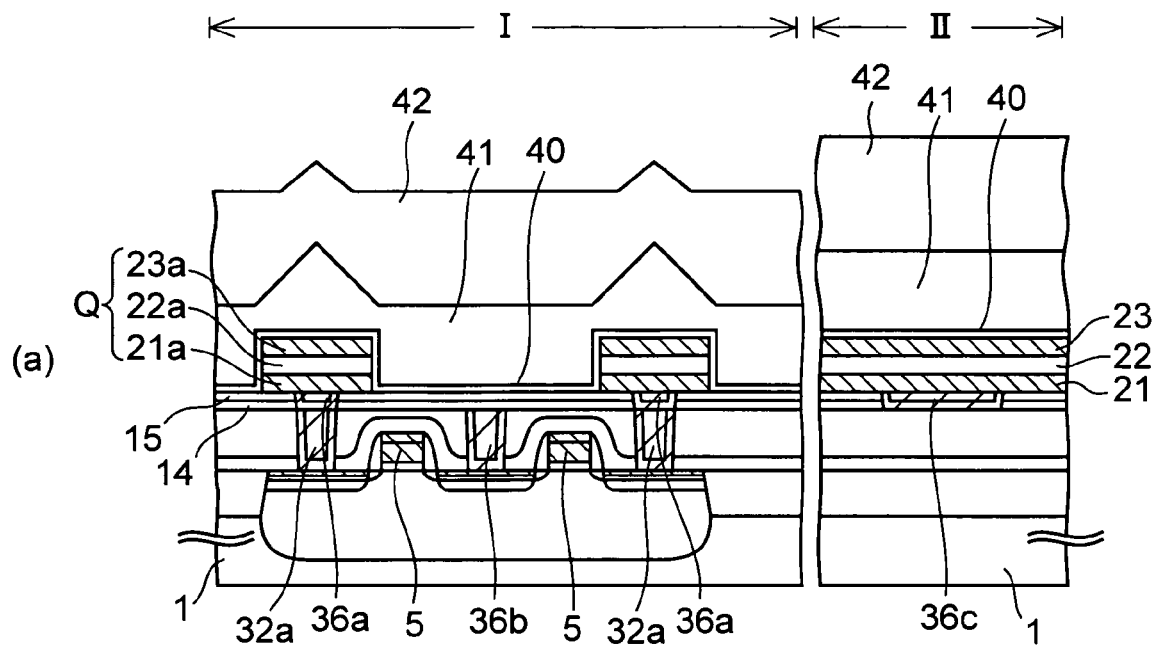
FIGS. 15(a), (b) are cross-sectional views of the semiconductor device in production according to the first embodiment of the present invention in which protective insulating films, a sacrificial insulating film and a resist are formed and the resist is patterned.
Figure 15:
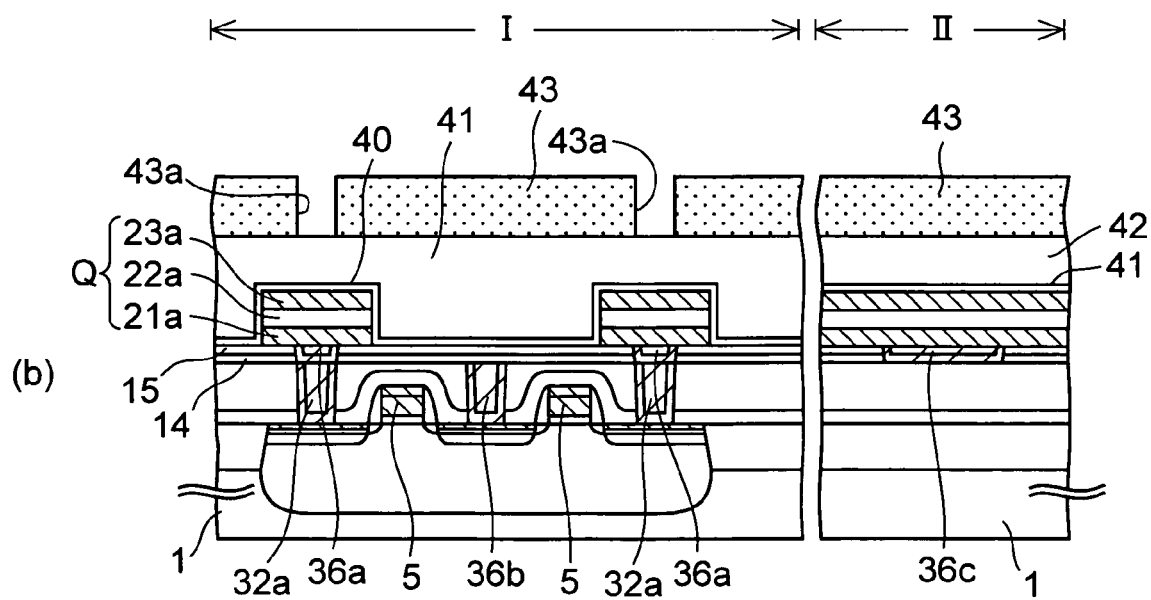
Figure 16:
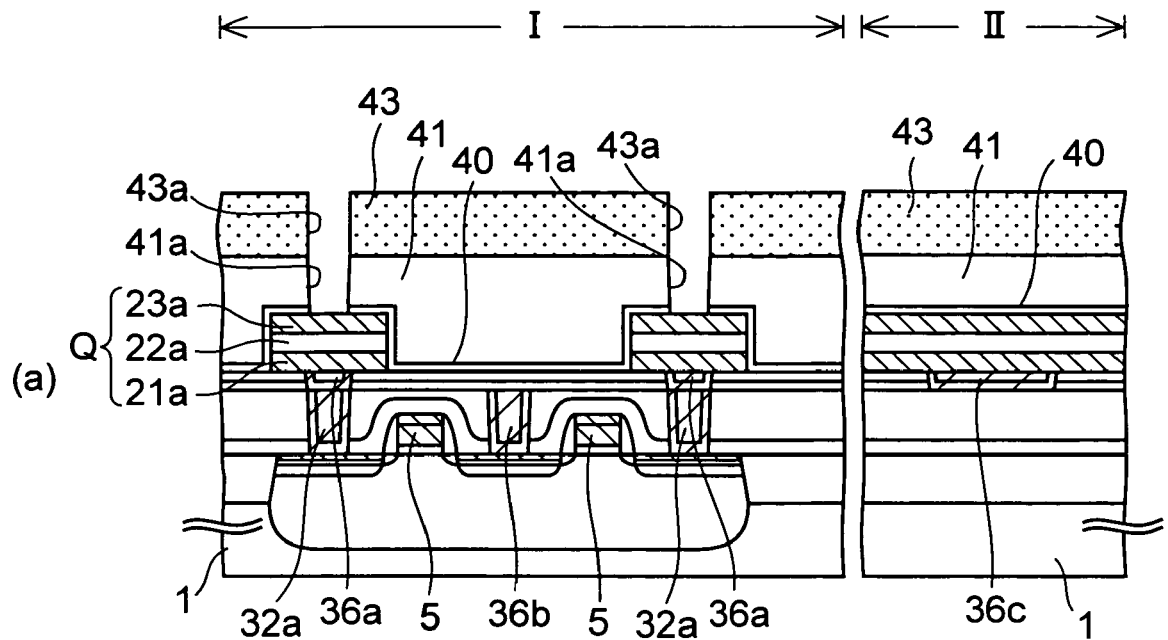
FIGS. 16(a), (b) are cross-sectional views of the semiconductor device in production according to the first embodiment of the present invention in which third holes are formed, and a resist is formed and patterned.
Figure 16:
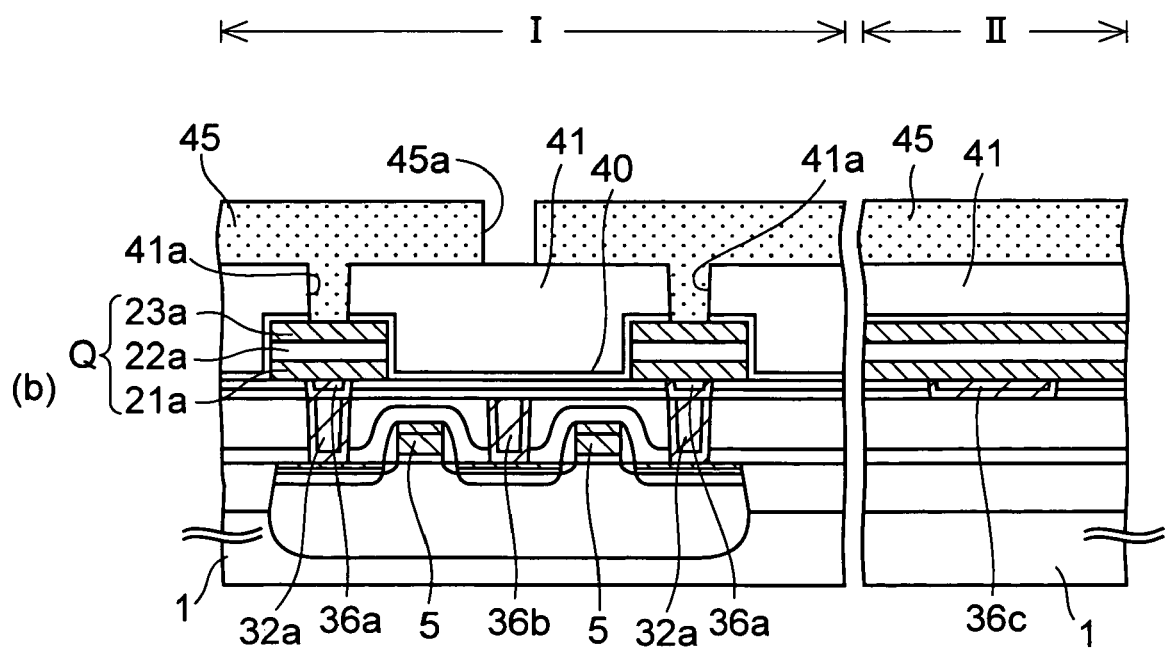
Figure 17:
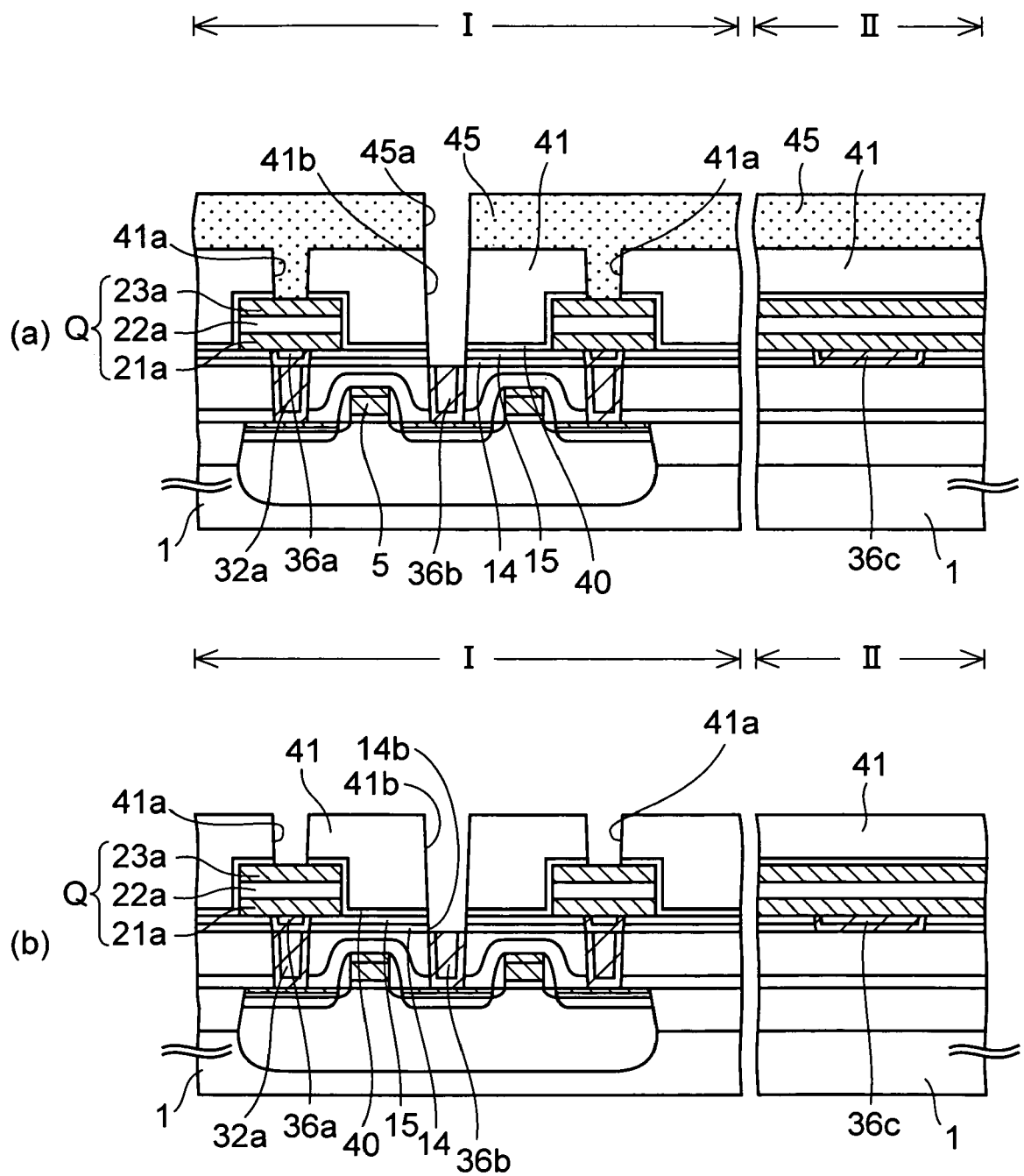
FIGS. 17(a), (b) are cross-sectional views of the semiconductor device in production according to the first embodiment of the present invention in which a forth hole is formed and resist is removed.
Figure 18:
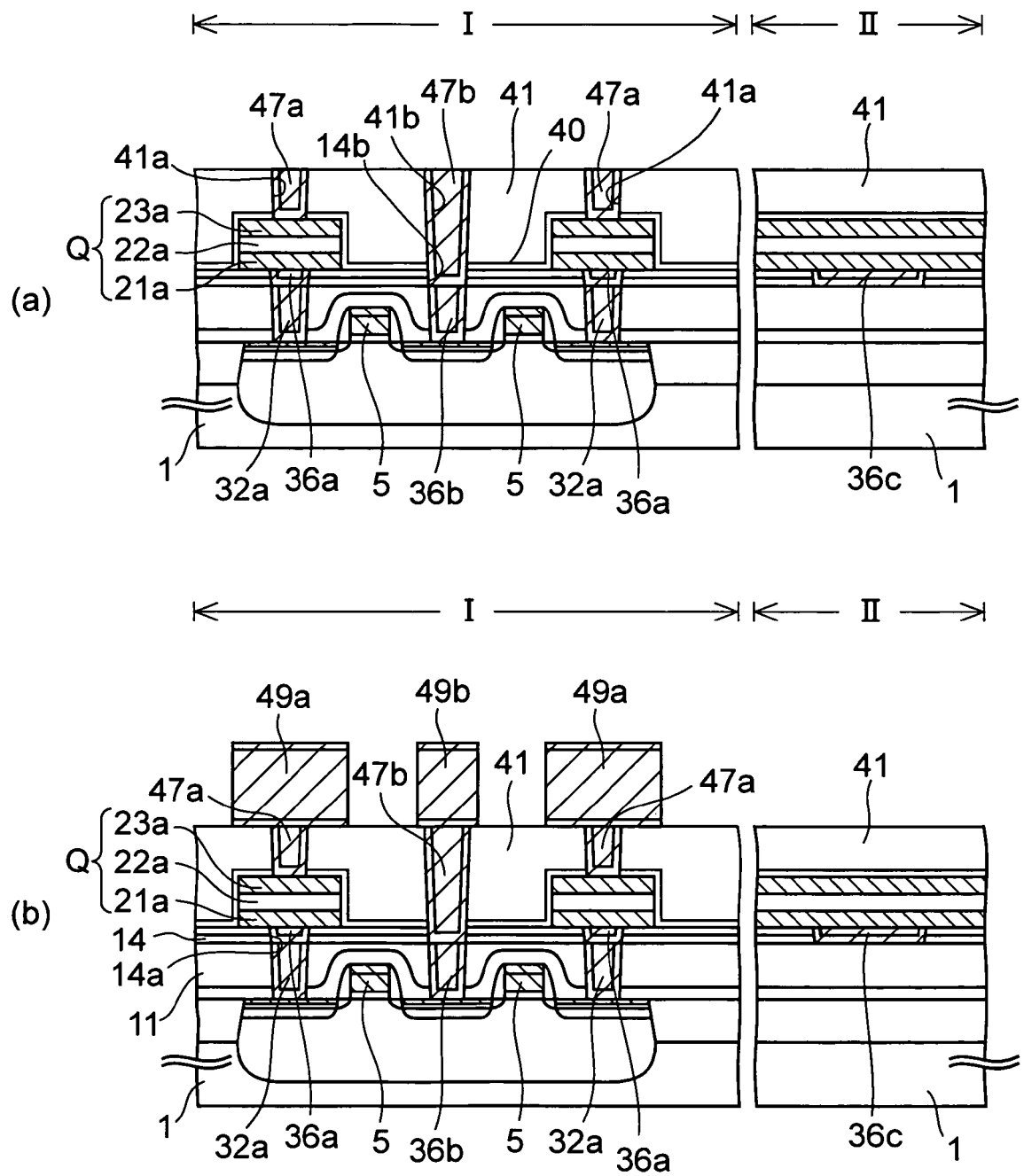
FIGS. 18(a), (b) are cross-sectional views of the semiconductor device in production according to the first embodiment of the present invention in which third and forth contact plugs and wiring are formed.

FIG. 7 and FIG. 8 are cross-sectional views of a hypothetical FeRAM in production when the tungsten film 18 thus completely fills the opening 11e. Note that in FIG. 7 and FIG. 8, the components described in FIG. 1-FIG. 6 have the same reference numerals as assigned in these figures and the detailed description thereof is omitted hereinafter.

First, during performance of the steps described in FIG. 1(a)-FIG. 3(a) and above, as shown in FIG. 7(a), the tungsten film 18 is formed on the barrier metal film 17, and the tungsten film 18 fills both the second contact hole 11d and opening 11e completely. The tungsten film 18 is considerably thicker than in the abovementioned example (see FIG. 3(b)) since it fills not only the second contact hole 11d but also the opening 11e wider than the hole 11d. The tungsten film 18 has to be about 900 nm thick on the planarized surface of the silicon substrate 1, for example.

Subsequently, as shown in FIG. 7(b), the excess barrier metal film 17 and tungsten film 18 on the insulating adhesive film 15 are removed by the CMP method to make the films left in the second contact hole 11d and the opening 11e into a second contact plug 19 and an alignment mark 20 respectively.

Incidentally, in order to prevent the tungsten film 18 and barrier metal film 17 from remaining on the portions other than the second contact hole 11d and opening 11e, this CMP is conducted under an overpolishing condition in which a polish amount is greater than the total thickness of the polished films. Particularly, since residual films of the CMP are easily left on the substrate as the thickness of the tungsten film 18 become thicker, the abovementioned overpolish amount is set to be larger than in the foregoing example in which the tungsten film 18 is thinner (see FIG. 3(c)).

As a result, as shown in FIG. 7(b), the insulating adhesive film 15 and the oxidation preventing insulating film 14 are unnecessarily polished so that dishing (becoming thinner) occurs in the film overlying the first contact plug 13c, and the second contact plug 19. Consequently, a recess is caused on the top surface thereof.

Next, the abovementioned steps shown in FIG. 4(a)-FIG. 6(b) are performed so as to form the capacitor Q shown in FIG. 8 on the second contact plug 19.

In this example, the opening 11e of the peripheral region H is completely filled with the alignment mark 20 composed of tungsten, and the conductive film for lower electrode 21 is formed thereon so as to have a uniform thickness. Therefore, even if the recovery-annealing is performed for the capacitor Q in oxygen atmosphere, the conductive film for lower electrode 21 suppresses oxygen permeability. Whereby no film 28, as shown in FIG. 6(b), is formed and problems, such as pattern failure caused by the peeled film 28, are avoided.

However, as described in FIG. 7(b), since the amount of overpolishing applied to the tungsten film 18 in CMP is increased, dishing occurs in the oxidation preventing insulating film 14 on the first contact plug 13c. This causes the difficulty in protecting the mainly tungsten first contact plug 13c from oxygen atmosphere with the oxidation preventing insulating film 14 during recovery-annealing. Hence, contact failure maybe caused by the oxidation of the first contact plug 13c.

In addition, the abovementioned CMP forms a recess on the top surface of the second contact plug 19 directly under the capacitor Q, thereby decreasing the flatness of the top surface. The decrease in even surface flatness caused by the recess decreases the orientation of iridium in the lower electrode 21a. Since the orientation of the capacitor dielectric film 22a depends largely on the orientation of the lower electrode 21a, the orientation of the capacitor dielectric film 22a decreases along with the decrease in the orientation of the lower electrode 21a, and eventually the ferroelectric properties of the capacitor dielectric film 22a are deteriorated.

In light of these problems, the inventors of this application have reached the embodiments of the present invention to be described in the following.

First Embodiment

FIG. 9-FIG. 18 are cross-sectional views of a semiconductor device in production according to a first embodiment of the present invention. Note that in these figures, the components described in FIG. 1-FIG. 8 have the same reference numerals as assigned in these figures and the detailed description thereof is omitted hereinafter.

This semiconductor device is an FeRAM of the stack-type, and is manufactured in a manner explained in the followings.

First, the steps of FIGS. 1(a) and (b) are performed as described in Preliminary Explanation. Next, as shown in FIG. 9(a), a photoresist, which is coated on the first insulating film 11, is exposed and developed to form a second resist pattern 30.

As shown in the figure, hole-shaped first and second windows 30a, 30b are formed respectively in the second resist pattern 30 directly above the first and second source/drain regions 8a, 8b.

Subsequently, as shown in FIG. 9(b), a high-frequency electricity such as at a frequency of 13.56 MHz and power of 1 kW-2.5 kW, is applied to the etching atmosphere. The first insulating film 11 and the cover insulating film 10 are etched through the abovementioned first and second windows 30a, 30b by RIE using a gas mixture of $C_4F_8$, Ar and $O_2$ as a etching gas. This results in the formation of first and second holes 11a, 11b above the first and second source/drain regions 8a, 8b respectively. Although the pressure of the abovementioned etching atmosphere is not limited, it is set to 2-7 Pa in this embodiment.

After completing the etching, the second resist pattern 30 is removed.

Next, a description is given of the steps necessary to obtain a sectional structure as shown in FIG. 9(c).

First, a titanium film of about 30 nm thick is formed on the top surface of the first insulating film 11 and inside the first and second holes 11a, 11b by the sputtering method. Furthermore, a titanium nitride film of about 20 nm thick is formed on the titanium film by a CVD method using, for example titanium tetrachloride gas ($TiCl_4$) as a reactive gas. The titanium nitride film and the abovementioned titanium film are used as a first barrier metal film 31.

Subsequently, a tungsten film 32 is formed on the first barrier metal film 31 by the CVD method using tungsten hexafluoride gas so as to completely fill the first and second holes 11a, 11b with the tungsten film 32.

As shown in FIG. 10(a), a CMP method utilizing a slurry (abrasive), for example, W2000 manufactured by Cabot Microelectronics Corporation is performed. The first insulating film 11 serves as a polishing stopper. The excess first barrier metal film 31 and tungsten film 32 on the first insulating film 11 are removed by polishing so that the films are left in the first and second holes 11a, 11b as first and second conductive plugs 32a, 32b.

Since the first and second conductive plugs 32a, 32b are formed in the same process, their top surfaces are the same in height. Furthermore, the first and second source/drain regions 8a, 8b are electrically connected to the first and second conductive plugs 32a, 32b respectively.

Next, as shown in FIG. 10(b), by a plasma CVD method using, for example silane ($SiH_4$) and $N_2O$ as a reactive gas, a silicon oxide nitride film is deposited on the top surface of each of the first and second conductive plugs 32a, 32b and first insulating film 11 to form an oxidation preventing insulating film 14. The oxidation preventing insulating film 14 is preferably formed to be thinner than the first insulating film 11, for example, about 130 nm thick.

Silicon oxide nitride composing the oxidation preventing insulating film 14 excels in oxygen impermeability compared with other insulating films. Therefore, the second conductive plug 32b, formed between the two gate electrodes 5, mainly composed of easily-oxidizable tungsten is protected from oxidizing atmosphere by the oxidation preventing insulating film 14. Hence, contact failure originating from abnormal oxidation during processing is prevented.

Additional, examples of insulating films with an oxygen impermeability function, comparable to the abovementioned silicon oxide nitride film, include a silicon nitride (SiN) film and an alumina ($Al_2O_3$) film. A single layer of each film may be formed as an oxidation preventing insulating film 14. In this case, the silicon nitride film is formed by the plasma CVD method using silane and ammonia as a reactive gas. Also, the alumina film is formed by a sputtering method.

Subsequently, a silicon oxide film of about 200 nm thick is formed on the abovementioned oxidation preventing insulating film 14 as an insulating adhesive film 15. Although the method of forming the silicon oxide film is not limited, the silicon oxide film is formed in this embodiment by the plasma CVD method using TEOS gas.

Then, as shown in FIG. 10(c), a photoresist is coated on the insulating adhesive film 15, and the photoresist is exposed and developed to form a third resist pattern 33. The third resist pattern 33 has a hole-shaped third window 33a above the second conductive plug 32a, and has a fourth window 33b wider than the third window 33a in the peripheral region II.

Subsequently, as shown in FIG. 11(a), the insulating adhesive film 15 and oxidation preventing insulating film 14 are etched directly under the abovementioned third and fourth windows 33a, 33b, respectively to form a first opening 14a and an alignment opening 14c in the oxidation preventing insulating film 14.

Although the etching conditions are not limited, RIE using a gas mixture of $C_4F_8$, Ar, and $O_2$ as an etching gas is employed in this embodiment.

The depth of the first opening 14a thus formed, which is equal to the total thickness of the oxidation preventing insulating film 14 and the insulating adhesive film 15, is about 330 nm. This value is smaller than the depth of the first and second holes 11a, 11b (about 900 nm) and the etching amount in this step is significantly smaller than that in FIG. 2(b). Therefore, the third resist pattern 33 is thinned less during etching compared with the case shown in FIG. 2(b). Hence, the third resist pattern 33 is left thicker after etching, so that the first opening 14a is formed with greater accuracy.

Subsequently, the third resist pattern 33 is removed.

Next, as shown in FIG. 11(b), a titanium nitride film of about 50 nm thick is formed on the top surface of the insulating adhesive film 15 and inside each of the openings 14a, 14c as a second barrier metal film 35.

In the case, described above, since the depth of the first opening 14a is shallow (about 330 nm), the second barrier metal film 35 does not have to be formed by the CVD method which is excellent in coverage but costly. Instead, the second barrier film 35 can be formed by the sputtering method at lower cost. However, the method of forming the second barrier metal film 35 is not limited to the sputtering method, and the second barrier metal film 35 may be formed by the CVD method in some cases.

Subsequently, a tungsten film is formed on the second barrier metal film 35 as a conductive film 36 and openings 14a, 14c are completely filled with the conductive film 36. The conductive film maybe formed by the CVD method using tungsten hexafluoride gas.

As mentioned above, since the depth of the alignment opening 14c is extremely shallow, the conductive film 36 required for filling it can be thinner than the tungsten film 18 described in FIG. 7(a). The conductive film 36 is formed as thin as about 300 nm on the flat surface of the insulating adhesive film 15 in this embodiment.

Subsequently, as shown in FIG. 11(c), while using the insulating adhesive film 15 as a polishing stopper, the excess second barrier metal film 35 and conductive film 36 on the insulating adhesive film 15 are removed by polishing by the CMP method. This results in the films being left only in the first opening 14a and alignment opening 14c. For a slurry in CMP, for example, W2000 manufactured by Cabot Microelectronics Corporation is employed.

The remaining second barrier metal film 35 and conductive film 36 become an auxiliary conductive plug 36a electrically connected to the first conductive plug 32a in the first opening 14a and become an alignment mark 36c in the alignment opening 14c, respectively.

Incidentally, in order to prevent residual conductive film 36 and second barrier metal film 35 from forming on the insulating adhesive film 15 other than the openings 14a, 14c, CMP is conducted under overpolishing condition. Specifically, a polish amount is set to be larger than the total thickness of the polished films.

Note that since the conductive film 36 to be polished is thin as mentioned above, the overpolish amount for leaving no unpolished part on the insulating adhesive film 15 can be smaller than that in the case shown in FIG. 7(b). Therefore, excessive polishing is not required. Even when polishing is applied by CMP as mentioned above, the occurrence of a recess on the top surface of the auxiliary conductive plug 36a and the occurrence of dishing in the oxidation preventing insulating film 14 or insulating adhesive film 15 is prevented. Hence, the flatness of the top surface of each of the insulating adhesive film 15 and auxiliary conductive plug 36a is improved after completing CMP.

Next, a description is given of the steps necessary to obtain a sectional structure as shown in FIG. 12(a).

First, a metal film having an oriented crystal structure, such as (111) is formed by the sputtering method on each of the auxiliary conductive plug 36a and the insulating adhesive film 15. The oriented metal film forms a conductive film for the lower electrode 21. Examples of the oriented metal film include an iridium film. In this embodiment, an iridium film is formed to be 50-200 nm thick, more preferably 100 nm thick.

As mentioned above, since the top surface of each of the insulating adhesive film 15 and the auxiliary conductive plug 36a has an even surface flatness, the crystal orientation of the lower electrode 21 is prevented from decreasing due to the unevenness of the underlying layer. Therefore, the lower electrode orientation is maintained.

Next, a PZT film is formed by a MOCVD method to be 50-150 nm thick, more preferably 100 nm thick on the conductive film for lower electrode 21. The PZT film forms a ferroelectric film 22. Note that examples of a method of forming the ferroelectric film 22, other than the MOCVD method, include a sputtering method and a sol-gel method.

Furthermore, a material of the ferroelectric film 22 is not limited to the abovementioned PZT. The ferroelectric film 22 may be composed of a Bi-layer structure compound; such as $SrBi_2Ta_2O_9$ and $SrBi_2(Ta, Nb)_2O_9$, PLZT obtained by doping lanthanum to PZT or another metal oxide ferroelectric substance.

The orientation of the ferroelectric film 22 depends largely on the orientation of the underlying conductive film of lower electrode 21. Since the conductive film for lower electrode 21 has a good orientation as mentioned above, the orientation of the ferroelectric film 22 is also improved.

Subsequently, an iridium oxide ($IrO_2$) film is formed on the ferroelectric film 22 by sputtering to a thickness of 50-200 nm, more preferably 100 nm thick. The iridium oxide film forms a conductive film for upper electrode 23.

Then, as shown in FIG. 12(b), after forming a titanium nitride film of about 200 nm thick is formed by the sputtering method on the conductive film for upper electrode 23 as a first mask material layer 25. A silicon oxide film of about 600 nm thick is further formed thereon by the CVD method as a second mask material layer 26.

Subsequently, a photoresist 27 is coated on the mask material layer 26.

Incidentally, the top surface of the alignment mark 36c is wider than the auxiliary conductive plug 36a and is slightly lower than the top surface of the insulating adhesive film 15 therearound. This is due to the overpolishing in the CMP step shown in FIG. 11(c). As a result, after completing the step of FIG. 12(b), a shallow concave portion (not shown) resulting from the alignment mark 36c is formed in the mask material layer 26 in the peripheral region II. The concave portion is typically shallow (about 50-100 nm).

The concave portion is utilized in the next step as shown in FIG. 13(a), first, the silicon substrate 1 is put in an exposure system (not shown) such as a stepper. Next, the abovementioned concave portion located over the alignment mark 36c is optically detected so as to align the exposure system with the silicon substrate 1 automatically.

Next, after exposing the photoresist 27 in the exposure system, the photoresist 27 is developed so as to form a resist pattern for capacitor 27a shown in FIG. 13(a). The resist pattern for capacitor 27a has a planer shape of the capacitor in the cell region I, and covers the alignment mark 36c in the peripheral region II.

Next, a description is given of the steps necessary to obtain a sectional structure as shown in FIG. 13(b).

First, using the resist pattern for capacitor 27a as an etching mask then removed. Next, the second mask material layer 26 is etched so as to form a hard mask 26a.

The resist pattern for capacitor 27a, while using the abovementioned hard mask 26a as a mask, the first mask material layer 25 is etched so as to leave the first mask material layer 25 only under the hard mask 26a.

Subsequently, as shown in FIG. 14(a), using an etching gas containing halogen gas, portions of the conductive film for lower electrode 21, ferroelectric film 22 and conductive film for upper electrode 23 not covered with the hard mask 26a are dry-etched simultaneously. After, performing this dry-etching, a capacitor Q composed of the stacked lower electrode 21a, capacitor dielectric film 22a and upper electrode 23a, is formed in the cell region I, and electrically connected to the auxiliary conductive plug 36a.

The lower electrode 21a composing the capacitor Q is prevented from being peeled off by the insulating adhesive film 15. Furthermore, since the insulating adhesive film 15 is composed of amorphous silicon oxide, it does not disturb the orientation of the lower electrode 21a as a crystalline film would. Hence, the desired orientation of the lower electrode 21 is properly maintained.

Subsequently, the hard mask 26a and the first mask material layer 25 are removed by wet etching and dry etching.

Next, as shown in FIG. 14(b), in order to repair damage that the capacitor dielectric film 22a may receive in the abovementioned etching step shown in FIG. 14(a) or the like, the silicon substrate 1 is put in a furnace to perform the first recovery annealing in oxygen atmosphere. Such a recovery annealing is performed for example at a substrate temperature of 550° C. for about 40 minutes for the capacitor dielectric film 22a.

In this case, since the alignment mark 36c is embedded in the alignment opening 14c almost completely, a thin portion 21b shown in FIG. 6(b) is not formed in the conductive film for lower electrode 21 on the alignment mark 36c. Therefore, even if recovery annealing in oxygen atmosphere is performed, the conductive film for lower electrode 21 can block oxygen. Hence, the alignment mark 36c is prevented from oxidizing.

Next, a description is given of the steps necessary to obtain a sectional structure as shown in FIG. 15(a).

First, in order to protect the capacitor dielectric film 22a from a reducing atmosphere such as hydrogen, an alumina film excellent in hydrogen blocking properties of about 50 nm thickness is formed on the entire upper surface of the silicon substrate 1 as a capacitor protect insulating film 40.

The method of forming the capacitor protect insulating film 40 is not limited. Note that since the capacitor protect insulating film 40 can be formed on the side of the capacitor Q with good coverage if the capacitor protect insulating film 40 is formed by a ALD (Atomic Layer Deposition) method. The ALD method is excellent in coverage properties. Hence, the interval between the adjacent capacitors Q can be reduced, and further FeRAM miniaturization can be achieved.

Next, a second insulating film 41 is formed on the capacitor protect insulating film 40 by a HDPCVD (High Density Plasma CVD) method using, for example silane as a reactive gas. The space between the two adjacent capacitors Q is filled with the second insulating film 41. The thickness of the second insulating film 41 is not limited, but is set to about 700 nm on the flat surface of the silicon substrate 1 in this embodiment.

Subsequently, a silicon oxide film is formed as a sacrificial insulating film 42 on the second insulating film 41, for example by the plasma CVD method using TEOS gas. The thickness of the sacrificial insulating film 42 is, for example, 800 nm on the flat surface of the silicon substrate 1.

Subsequently, as shown in FIG. 15(b), after the top surfaces of the sacrificial insulating film 42 and second insulating film 41 are planarized by polishing using CMP method, a photoresist is coated on the second insulating film 41. The photoresist, is exposed and developed to form a fourth resist pattern 43 having a hole-shaped fifth window 43a above the upper electrode 23a.

As shown in FIG. 16(a), the second insulating film 41 and the capacitor protective insulating film 40 are then etched through the abovementioned fifth window 43a to form, in the insulating films 40, 41, a third hole 41a deep enough to reach the upper electrode 23a. This etching is performed for example by a parallel plate type plasma etching equipment using a gas mixture of $C_4F_8$, Ar and $O_2$ as an etching gas and in an etching pressure of 2-7 Pa. Furthermore, high-frequency electricity at a frequency of 13.56 MHz and with power of 1 kW-2.5 kW is applied to the upper electrode of the etching equipment, thereby plasma-activating the abovementioned etching gas.

Then, after removing the fourth resist pattern 43, in order to repair damage the capacitor dielectric film 22a may have received in the steps so far, the silicon substrate 1 is put in a furnace so as to perform the second recovery annealing. The second recovery annealing is performed, for example, in oxygen atmosphere at a substrate temperature of 550° C. for about 40 minutes.

Next, as shown in FIG. 16(b), a photoresist, which is coated again on the second insulating film 41, is exposed and developed to form a fifth resist pattern 45. The development forms a hole-shaped sixth window 45a in the fifth resist pattern 45 above the second conductive plug 36b.

Subsequently, as shown in FIG. 17(a), through the sixth window 45a in the fifth resist pattern 45, the second insulating film 41, the capacitor protect insulating film 40, the insulating adhesive film 15 and the oxidation preventing insulating film 14 are etched. This forms a fourth hole 41b in the second insulating film 41 and forms a second opening 14b in the oxidation preventing insulating film 14 under the fourth hole 41b. Such an etching is performed for example by a parallel plate type plasma etching equipment with a gas mixture of $C_4F_8$, Ar, $O_2$ and CO as an etching gas. The pressure is set to be 2-7 Pa and a high-frequency electricity at a frequency of 13.56 MHz and power of 1 kW-2.5 kW is applied to the upper electrode of the etching equipment in this etching process.

Thus, the deep fourth hole 41b is formed separately from the shallow third hole 41a on the upper electrode 23a and above the second source/drain region 8b. This formation prevents the upper electrode 23a under the shallow third hole 41a from being exposed to etching atmosphere for a long time and suppresses the deterioration of the capacitor dielectric film 22a thereunder.

Furthermore, since the second conductive plug 36b on the second source/drain region 8b is covered with the oxidation preventing insulating film 14 until this step finishes, occurrences of contact failure due to the oxidation of the tungsten composing the second conductive plug 36b are prevented.

Subsequently, as shown in FIG. 17(b), the fifth resist pattern 45 is removed.

Next, a description is given of the steps necessary to obtain a sectional structure as shown in FIG. 18(a).

First, a titanium nitride film of about 50 nm thick is formed by the sputtering method on the top surface of the second insulating film 41 and inside each of the third and fourth holes 41a, 41b as a barrier metal film. A tungsten film is then formed on the barrier metal film. The tungsten film is thick enough to fill the third and fourth holes 41a, 41b, for example, 300 nm thick on the planarized surface of the second insulating film 41.

Subsequently, the excess barrier metal film and tungsten film on the second insulating film 41 are removed by the CMP method so that the films are left in the third and fourth holes 41a, 41b as third and fourth conductive plugs 47a, 47b, respectively.

Of these conductive plugs, the third conductive plug 47a is electrically connected to the upper electrode 23a. The fourth conductive plug 47b, which is electrically connected to the second conductive plug 36b, composes a part of bit line together with the second conductive plug 36b.

Next, a description is given of the steps necessary to obtain a sectional structure as shown in FIG. 18(b).

First, a metal laminated film is formed by the sputtering method on the top surface of each of the second insulating film 41 and the third and fourth conductive plugs 47a, 47b. The metal laminated film is, for example, composed by laminating a titanium nitride film of about 50 nm thick, an aluminum film of about 360 nm thick and a titanium nitride film of about 70 nm thick in this order.

Subsequently, the metal laminated film is patterned by photo lithography to form a first layer metal wiring 49a and metal pad for bit line 49b which is electrically connected to the third and fourth conductive plugs 47a, 47b, respectively.

After this, this embodiment may include a step of forming a third insulating film on the first layer metal wiring 49a and metal pad 49b, but the detailed description thereof is omitted hereinafter.

By the steps so far, the basic structure of the semiconductor device according to the first embodiment is completed.

According to the manufacturing method of a semiconductor device described above, as shown in FIG. 18(b), the conductive plug right under the capacitor Q is divided into the first conductive plug 12a and the auxiliary conductive plug 36a.

Since the first opening 14a in which the auxiliary conductive plug 36a is embedded is formed in the oxidation preventing insulating film 14 which is thinner than the first insulating film 11, the etching amount utilized to form the first opening 14a in the step shown in FIG. 11(a) is smaller. Therefore, the third resist pattern 33 maintains its approximate original thickness during etching, and the first opening 14a is formed with greater accuracy while etching because this third resist pattern 33 serves as a superior mask.

Furthermore, in this embodiment, since the alignment opening 14c is formed in the oxidation preventing insulating film 14 in the same process as the abovementioned first opening 14a, the depth of the alignment opening 14c can become shallower similarly to the first opening 14a. As a result, as shown in FIG. 11(b), the thickness of the conductive film 36 required for filling the alignment mark 14c completely can be formed thinner than the tungsten film 18 shown in FIG. 7(a). Therefore, the overpolish amount can be reduced for the tungsten film 18 in the CMP step shown in FIG. 11(c). In above CMP step, almost no recess occurs on the top surface of the auxiliary conductive plug 36a, and the dishing of the oxidation preventing insulating film 14 and insulating adhesive film 15 is suppressed.

Further in this embodiment, the lower electrode 21a is formed on the auxiliary conductive plug 36a having a flat top surface. Hence, orientation deterioration in the lower electrode 21a originating from unevenness of the underlying layer is avoided. The lower electrode 21a thus has a required orientation which improves the orientation of the capacitor dielectric film 22a thereon. Therefore, this embodiment provides a high-quality FeRAM where the ferroelectric properties of the capacitor dielectric film 22a are improved.

Furthermore, as mentioned above, since no dishing occurs in the oxidation preventing insulating film 14, the oxidation preventing insulating film 14 can maintain its oxygen impermeability throughout processing. As a result, contact failure is prevented from occurring due to the oxidation of the second conductive plug 36b composing the part of bit line.

Note that, although the abovementioned embodiment relates to the case in which the fourth hole 41b and the second opening 14b are formed at the same time and the second recovery annealing is then performed for the capacitor dielectric film 22a as described using FIG. 17(a), the present invention is not limited to this case.

For example, in the step shown in FIG. 17(a), the abovementioned recovery annealing may be performed in a state that the fourth hole 41b is formed with the oxidation preventing insulating film 14 as an etching stopper film and the second conductive plug 36b is covered with the oxidation preventing insulating film 14. In this case, the second opening 14b is formed by etching the oxidation preventing insulating film 14 under the fourth hole 41b after the recovery annealing finishes.

Second Embodiment

In the abovementioned first embodiment, as described in FIG. 11(b), (c), the auxiliary conductive plug 36a is composed of the laminated film of the second barrier metal film 35 and the conductive film 36. In this embodiment, in contrast, an auxiliary conductive plug 36a is composed of a conductive film 36 only.

Figure 19:
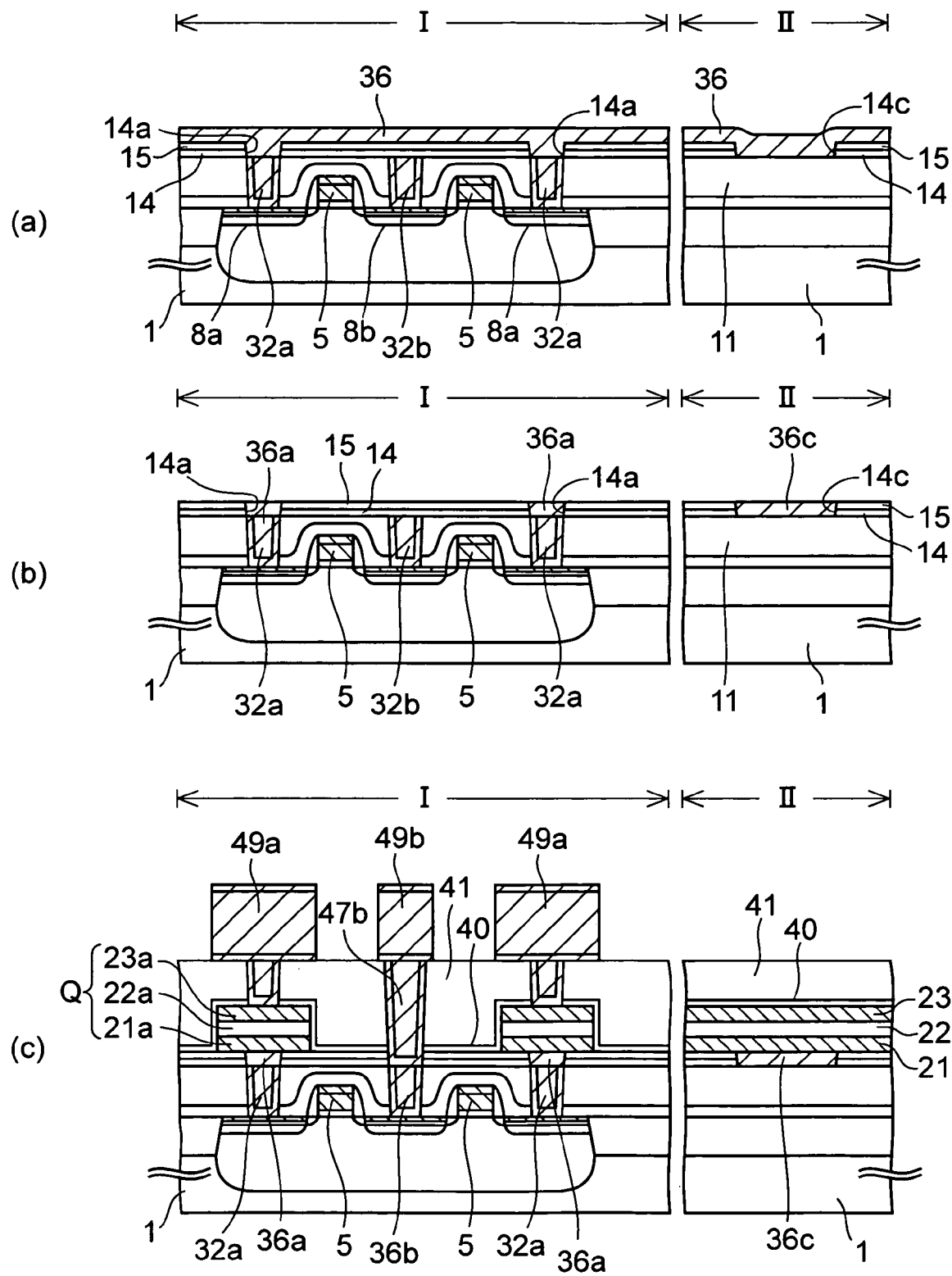
FIGS. 19(a)-(c) are cross-sectional views of a semiconductor device in production according to a second embodiment of the present invention in which single layer auxiliary conductive plugs are formed.

FIG. 19(a)-FIG. 19(c) are cross-sectional views of a semiconductor device in production according to a second embodiment of the present invention. Note that in these figures, the components described in the first embodiment have the same characters assigned as in the first embodiment and the detailed description thereof is omitted hereinafter.

In order to produce the semiconductor device according to this embodiment, the steps shown in FIG. 9(a)-FIG. 11(a) described in the first embodiment are performed.

Subsequently, as shown in FIG. 19(a), a conductive film 36 is formed as a single layer on the top surface of an insulating adhesive film 15 and in each of openings 14a, 14c. The conductive film 36 fills each of the openings 14a, 14c completely.

The material composing the conductive film 36 is not limited, but either a single layer of titanium nitride film or titanium aluminum nitride film is formed by the sputtering method as the conductive film 36 in this embodiment. When forming a titanium aluminum nitride film by the sputtering method as the conductive film 36, for example, a titanium target containing 5% aluminum is employed and a gas mixture of nitrogen and argon is used as a sputtering gas. This results in the titanium in the target at a vapor phase being nitrided so as to obtain a titanium aluminum nitride film.

Next, as shown in FIG. 19(b), using the insulating adhesive film 15 as a polishing stopper, the excess conductive film 36 on the insulating adhesive film 15 are removed by the CMP method. In CMP, for a slurry, for example, W2000 manufactured by Cabot Microelectronics Corporation is employed.

The conductive film 36 in the first opening 14a forms an auxiliary conductive plug 36a, and the conductive film 36 in the alignment opening 14c becomes an alignment mark 36c.

Subsequently, the steps shown in FIG. 12(a)-FIG. 18(b) described in the first embodiment are taken so as to complete a semiconductor device having a capacitor Q as shown in FIG. 19(c).

According to this embodiment mentioned above, since the auxiliary conductive plug 36a is composed of a single layer of a titanium nitride film or titanium aluminum nitride film which are less easily-oxidizable than tungsten. Hence, the plug 36a has a larger thermal resistance compared with the first embodiment in which tungsten is employed for the auxiliary conductive plug 36a. Therefore, the contact properties of the auxiliary conductive plug 36a can be stabilized even when a thermal process such as annealing is conducted.

The invention as described above is specifically directed to the noted embodiments. However, the present invention is not restricted to the embodiments. One of skill in the art may modify the described embodiments and still practice the invention as claimed below.

What is claimed is:

1. A manufacturing method of a semiconductor device, comprising the steps of:

forming first and second impurity diffusion regions at an interval from each other in a surface layer of a semiconductor substrate;

forming a first insulating film over said semiconductor substrate;

forming first and second holes in said first insulating film above said first and second impurity diffusion regions respectively by patterning said first insulating film;

forming first and second conductive plugs electrically connected to said first and second impurity diffusion regions respectively in said first and second holes;

forming an oxidation preventing insulating film on said first insulating film and on said first and second conductive plugs;

forming a first opening in said oxidation preventing insulating film above said first conductive plug by removing said oxidation preventing insulating film from above said first conductive plug;

forming a conductive film on said oxidation preventing insulating film and in said first opening above said first conductive plug; polishing said conductive film to remove said conductive film from said oxidation preventing insulating film, while leaving said conductive film in said first opening as an auxiliary conductive plug; forming a capacitor by stacking a lower electrode, a capacitor dielectric film and an upper electrode in this order on said auxiliary conductive plug and on said oxidation preventing insulating film located around said first opening;

forming a second insulating film covering said capacitor; forming a third hole in said second insulating film above said upper electrode by patterning said second insulating film;

forming a fourth hole in said second insulating film above said second hole by patterning said second insulating film, and further forming a second opening in said oxidation preventing insulating film under said fourth hole;

forming a third conductive plug electrically connected to said upper electrode in said third hole; and forming a fourth conductive plug in said fourth hole and said second opening to electrically connected to said second conductive plug.

2. The manufacturing method of a semiconductor device according to claim 1, wherein in the step of forming said oxidation preventing insulating film, said oxidation preventing insulating film is formed to be thinner than said first insulating film.

3. The manufacturing method of a semiconductor device according to claim 1, wherein said conductive film consists of any one of: a laminated film of barrier metal film and tungsten film; a single layer of titanium nitride film; and a single layer of titanium aluminum nitride film.

4. The manufacturing method of a semiconductor device according to claim 1, wherein the oxidation preventing insulating film consists of any one of: a silicon oxide nitride film, a silicon nitride film, and an alumina film.

5. The manufacturing method of a semiconductor device according to claim 1, further comprising a step of forming an insulating adhesive film on said oxidation preventing insulating film, after forming said oxidation preventing insulating film, wherein said lower electrode and said second insulating film are formed on said insulating adhesive film.

6. The manufacturing method of a semiconductor device according to claim 1, wherein, after forming said fourth hole, annealing said capacitor dielectric film in oxygen atmosphere, and after said annealing forming said second opening.

* * * * *